(12) United States Patent
Kuboi et al.

(10) Patent No.: US 8,958,073 B2
(45) Date of Patent: Feb. 17, 2015

(54) IMAGING APPARATUS, ELECTRONIC APPARATUS, PHOTOVOLTAIC CELL, AND METHOD OF MANUFACTURING IMAGING APPARATUS

(75) Inventors: Nobuyuki Kuboi, Kanagawa (JP); Kazuhiro Hongo, Kanagawa (JP)

(73) Assignee: Sony Corporation, Tokyo (JP)

( * ) Notice: Subject to any disclaimer, the term of this patent is extended or adjusted under 35 U.S.C. 154(b) by 651 days.

(21) Appl. No.: 13/317,550

(22) Filed: Oct. 21, 2011

(65) Prior Publication Data
US 2012/0154816 A1   Jun. 21, 2012

(30) Foreign Application Priority Data

Dec. 15, 2010   (JP) .................................. 2010-279359

(51) Int. Cl.
| | |
|---|---|
| G06K 9/00 | (2006.01) |
| G01N 21/55 | (2014.01) |
| H01L 27/146 | (2006.01) |
| H01L 31/04 | (2014.01) |
| H01L 31/08 | (2006.01) |
| G01J 3/36 | (2006.01) |
| G01J 5/12 | (2006.01) |

(52) U.S. Cl.
CPC .......... *H01L 27/14643* (2013.01); *H01L 31/04* (2013.01); *H01L 31/08* (2013.01); *G01J 3/36* (2013.01); *G01J 5/12* (2013.01); *Y02E 10/50* (2013.01)
USPC ............................. 356/445; 382/100; 382/128

(58) Field of Classification Search
USPC ................................... 356/445; 382/100, 128
See application file for complete search history.

(56) References Cited

FOREIGN PATENT DOCUMENTS

| | | | |
|---|---|---|---|
| EP | 1209455 | * 11/2001 | ............... G01J 5/10 |
| JP | 2009-038352 | 2/2009 | |
| JP | 2009-175124 | 8/2009 | |
| JP | 2009-528542 | 8/2009 | |
| JP | 2009-277732 | 11/2009 | |

* cited by examiner

*Primary Examiner* — Tarifur Chowdhury
*Assistant Examiner* — Sunghee Y Gray
(74) *Attorney, Agent, or Firm* — Rader, Fishman & Grauer PLLC

(57) ABSTRACT

An imaging apparatus includes: an imaging unit in which a plurality of pixels receiving incidence light on a light receiving face are disposed in an imaging region of a substrate, wherein the pixel includes a thermocouple device group in which a plurality of thermocouples are aligned along the light receiving face, wherein, in the thermocouple device group, the plurality of thermocouples are arranged so as to be separated from each other such that the light receiving face has a grating structure, and wherein the thermocouple device group is disposed such that the incidence light is incident to the grating structure so as to cause plasmon resonance to occur on the light receiving face, and an electromotive force is generated due to a change in the temperature of a portion of the thermocouple device group, at which the plasmon resonance occurs, in each of the plurality of thermocouples.

19 Claims, 31 Drawing Sheets

FIG.3
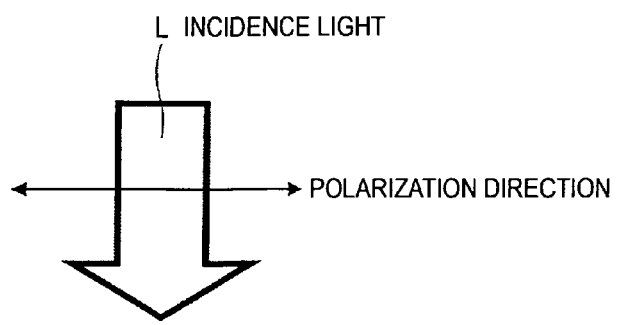
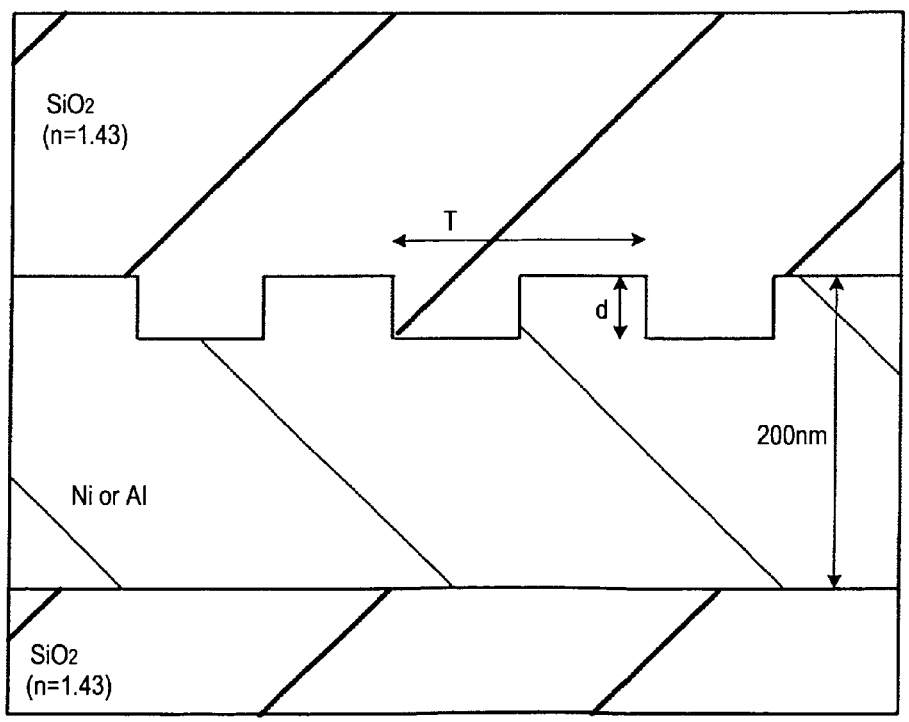

<EMBODIMENT 1>

FIG.8
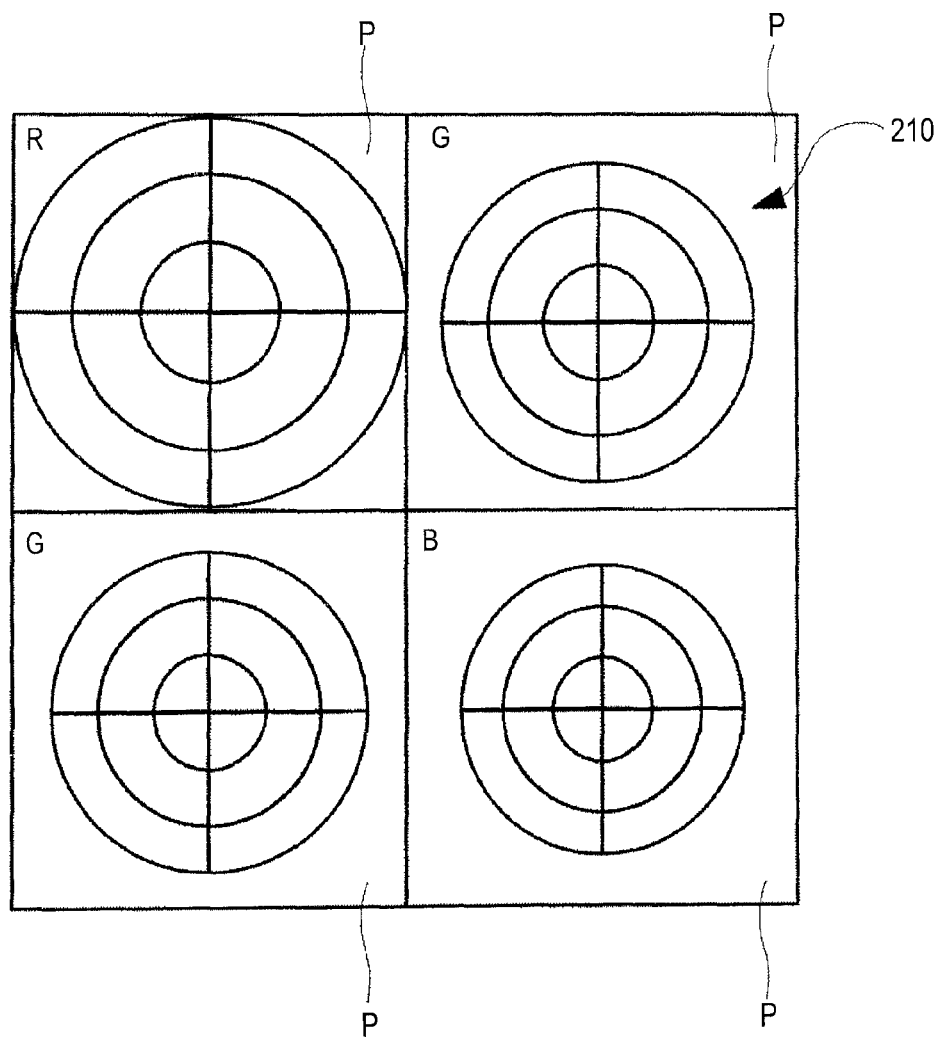
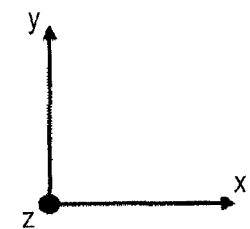

<EMBODIMENT 1>
FIG.9A
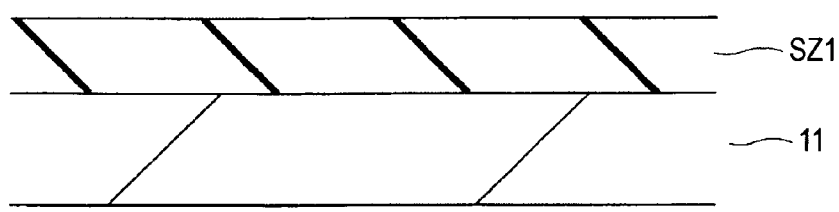
FIG.9B
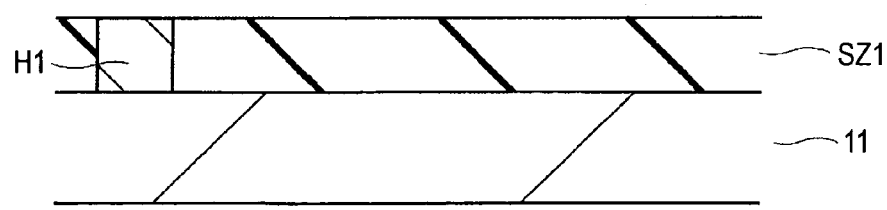
FIG.9C
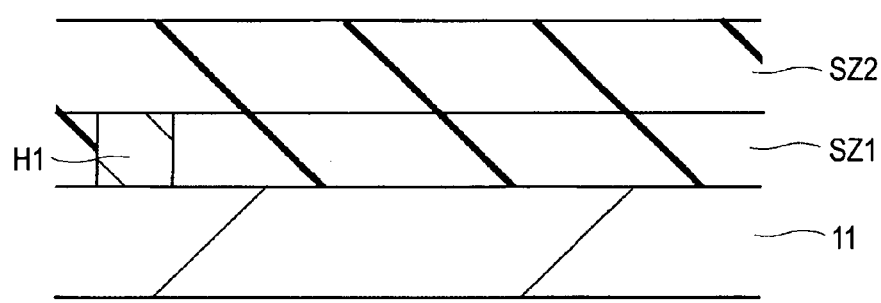
FIG.9D
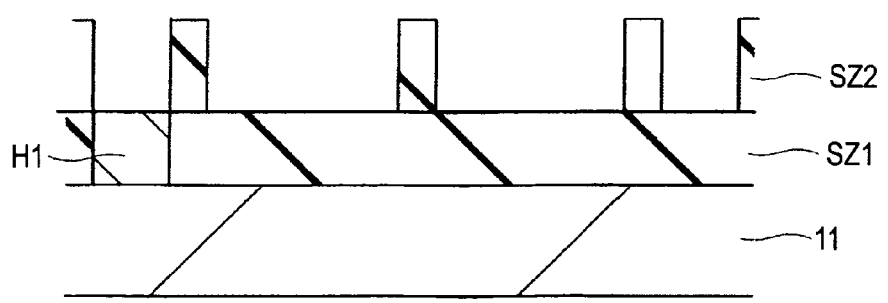
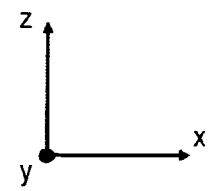

<EMBODIMENT 1>
FIG.10E
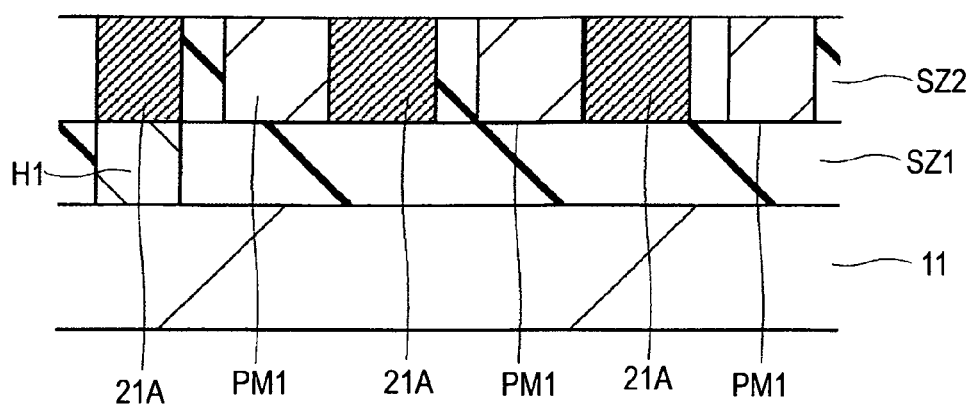
FIG.10F
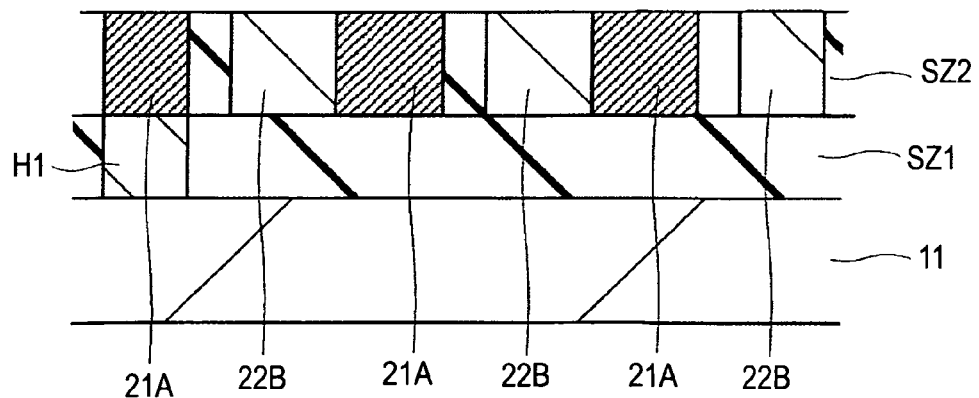
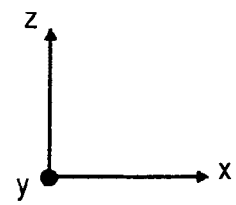

<EMBODIMENT 1>

<EMBODIMENT 1>

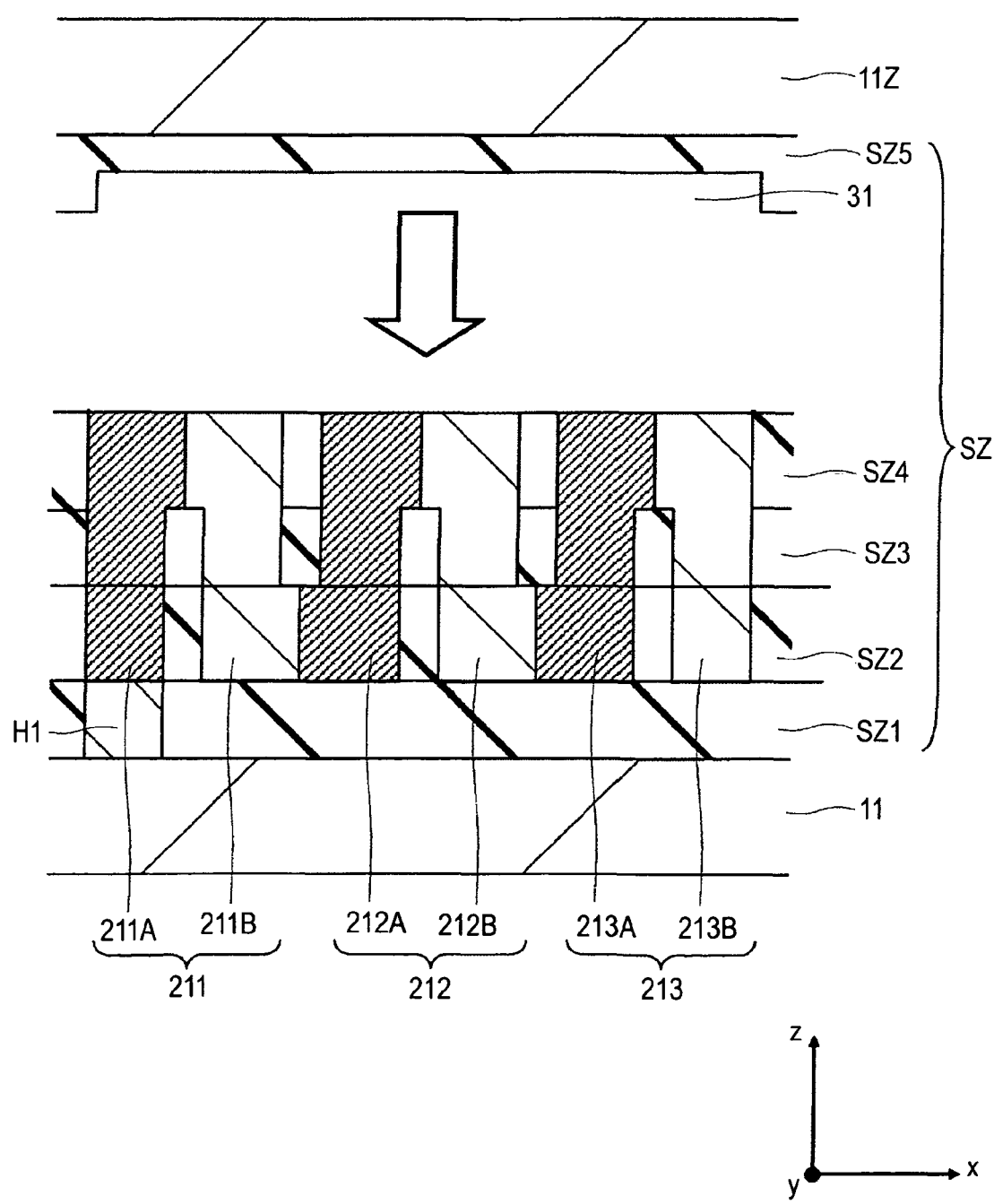

<MODIFIED EXAMPLE 1>

<MODIFIED EXAMPLE 2>

FIG.16
<MODIFIED EXAMPLE 3>
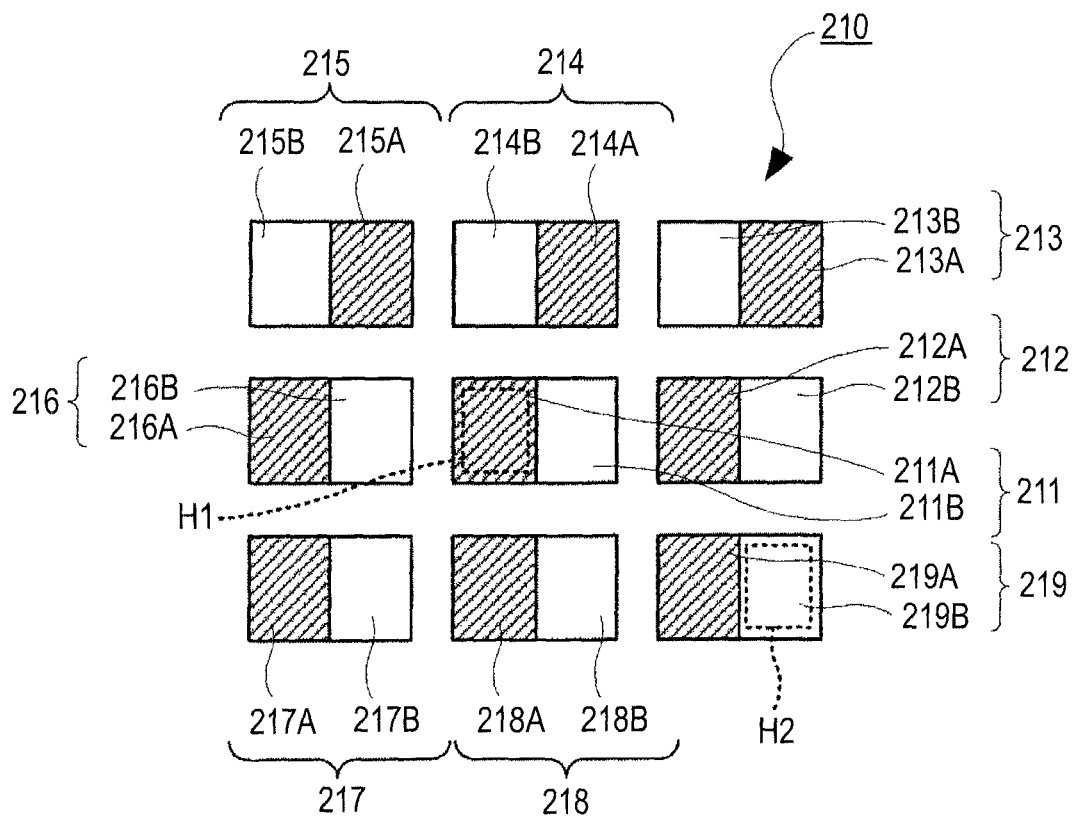
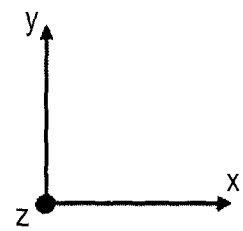

<MODIFIED EXAMPLE 3>

<EMBODIMENT 3>

<EMBODIMENT 4>

<EMBODIMENT 4>

<EMBODIMENT 4>

FIG.23
<EMBODIMENT 5>
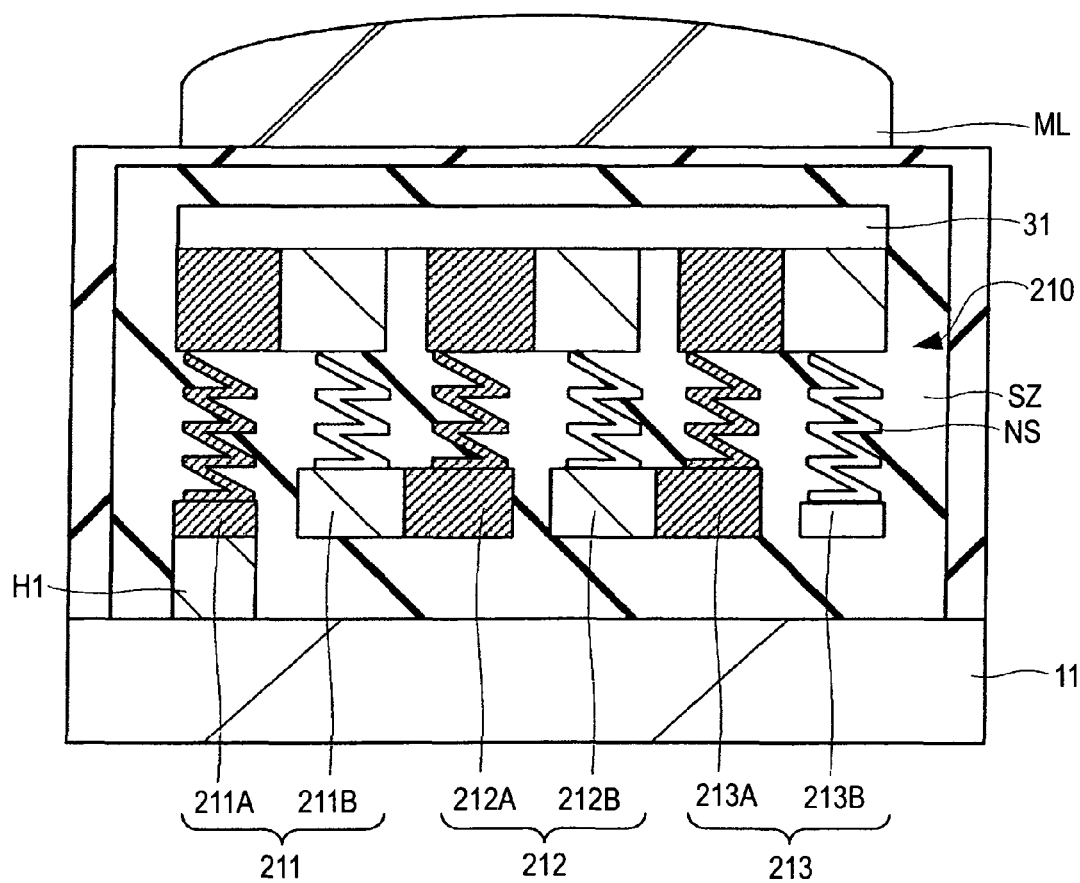
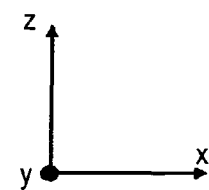

<EMBODIMENT 6>

<EMBODIMENT 6>

<EMBODIMENT 7>

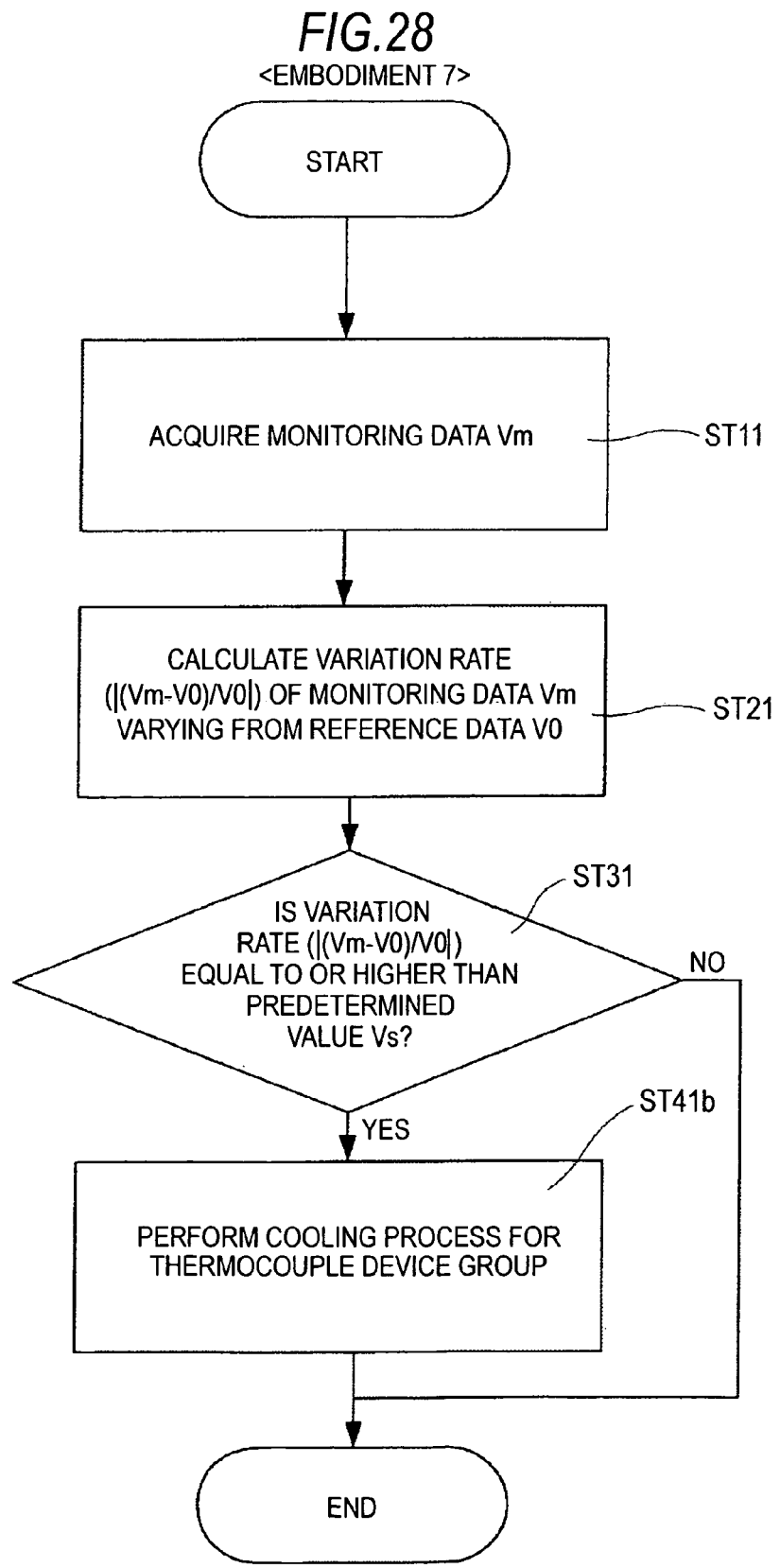

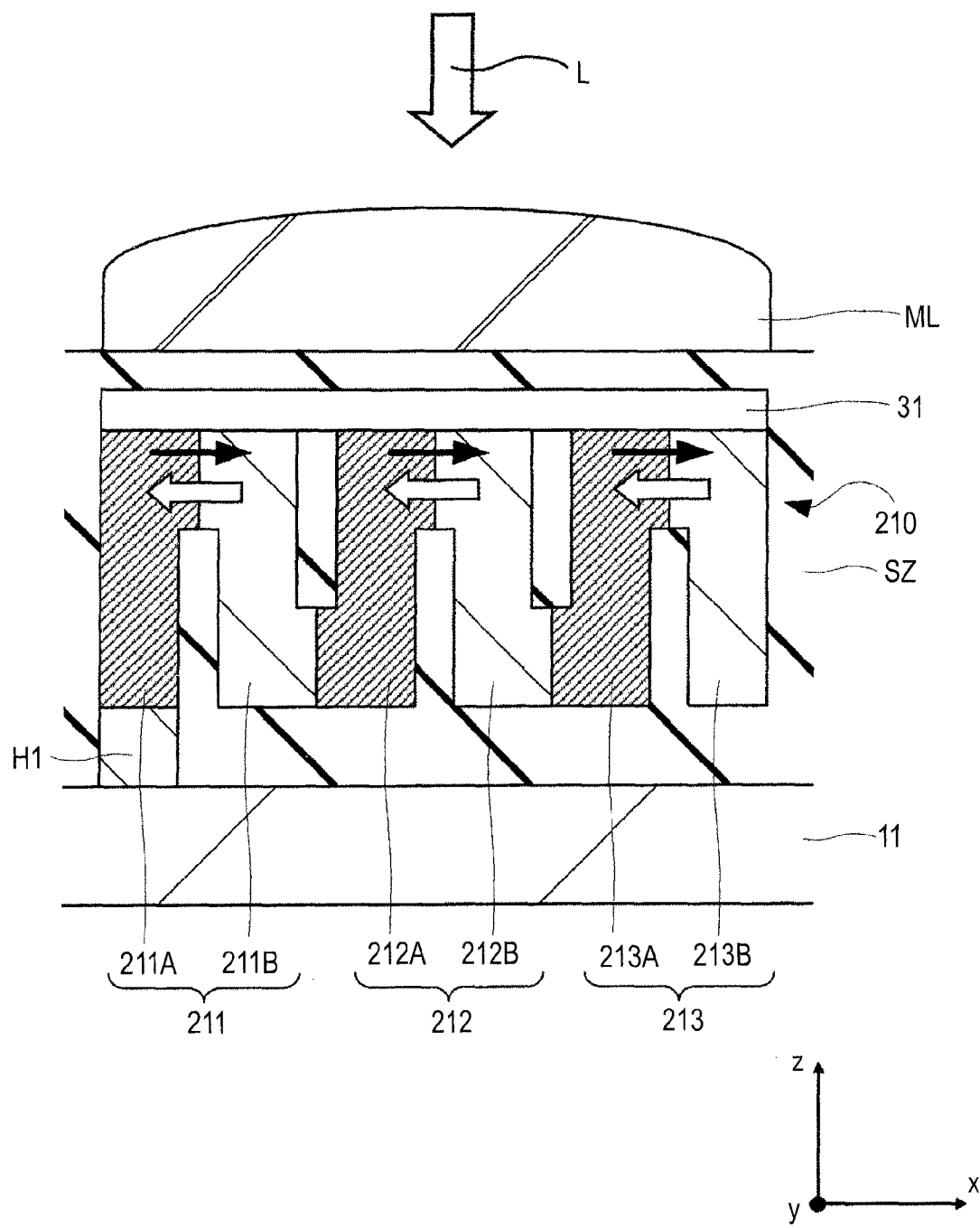

<EMBODIMENT 8>

FIG.31
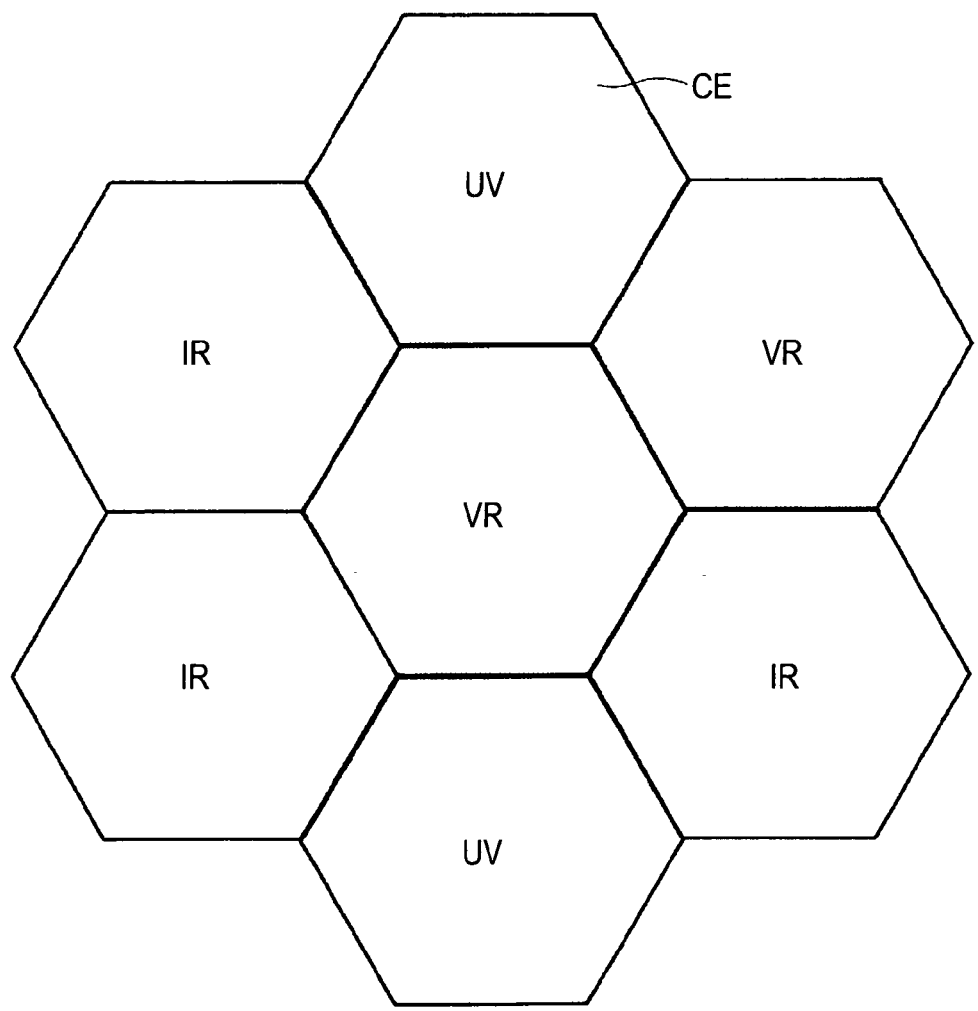
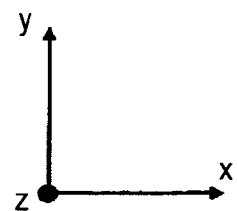

IMAGING APPARATUS, ELECTRONIC APPARATUS, PHOTOVOLTAIC CELL, AND METHOD OF MANUFACTURING IMAGING APPARATUS

FIELD

The present disclosure relates to an imaging apparatus, an electronic apparatus, a photovoltaic cell, and a method of manufacturing an imaging apparatus.

BACKGROUND

Electronic apparatuses such as digital cameras include imaging apparatuses. In the imaging apparatuses, an imaging region in which a plurality of pixels are arranged is arranged on a face of a substrate. The imaging apparatus receives incident light incident as a subject image in the imaging region and generates a captured image. Here, for example, a color image is generated as a captured image by receiving light of three primary colors.

For example, the imaging apparatuses include a CCD (Charge Coupled Device) type image sensor and a CMOS (Complementary Metal Oxide Semiconductor) type image sensor. In such a case, in the imaging region, in each of the plurality of pixels, for example, a photodiode is arranged as a photoelectric transducer (for example, see JP-A-2009-277732). To be more specific, as illustrated in JP-A-2009-277732, by performing ion implantation of impurities for a silicon semiconductor substrate, a photodiode is formed, and the photodiode receives incidence light and performs photoelectric conversion of the incidence light, thereby generating signal electric charge.

In addition, it is proposed to perform an imaging process by detecting light using a device that uses plasmon resonance (for example, see JP-A-2009-38352, JP-T-2009-528542, and JP-A-2009-175124).

The plasmon resonance is a phenomenon in which surface plasmon resonates so as to be excited on a metal surface in accordance with evanescent light generated by allowing incidence light to incident to the metal surface and locally strengthens an electric field. Accordingly, in this method, imaging is performed by using a signal that is acquired based on the locally strengthened electric field.

More specifically, in the case disclosed in JP-A-2009-38352, light is incident to the surface of a grating structure on which convexoconcavities are periodically formed by using a semiconductor material, and electric field energy is generated based on plasmon resonance. Then, the electric field energy is used for photoelectric conversion in a silicon layer, thereby performing light detection. Here, by appropriately changing the shape of the grating structure, light of specific wavelengths is selectively detected, whereby a color image is created.

In the case of JP-T-2009-528542, light is incident to a wave interface between metal and a dielectric, and electric field energy is generated based on plasmon resonance. Here, three wave interfaces are stacked in correspondence with respective light of three primary colors. Thus, the electric field energy of plasmon generated on the interfaces is used for photoelectric conversion in a semiconductor layer, electrons are generated with high efficiency, thereby performing light detection.

In the case of JP-A-2009-175124, a nanochain in which a plurality of metal nanoparticles are connected is arranged on an insulating film, and light is incident thereto, whereby plasmon resonance occurs. Accordingly, light detection is performed by reading out a change in the resistance of a diode disposed on a lower layer or a change in the electric potential due to a thermocouple for the electric field energy (exothermic energy) according to the occurrence of the plasmon resonance.

SUMMARY

In the description presented above, as in JP-A-2009-277732, in a case where a photodiode is disposed in the pixel, there are cases where recombination or generation of electrons occurs due to a defect in the silicon crystal. Accordingly, there are cases where a signal charge is generated so as to output an imaging signal even in a case where light is not incident to the pixel. As a result, a so-called white point (white scratch) is generated in a captured image, and accordingly, there is a case where the image quality deteriorates.

Similarly, in the cases of JP-A-2009-38352 and JP-T-2009-528542, photoelectric conversion in the semiconductor layer is used, and accordingly, there are cases where the image quality deteriorates due to the generation of a white point (white scratch) in a captured image.

In contrast to this, in a case where electrons are not propagated inside the semiconductor layer (silicon crystal), differently from the above-described cases, a white point (white scratch) is not generated in a captured image in principle.

However, in the case of JP-A-2009-175124, since a spatially-isotropic nanochain structure is used, there is high polarization dependency. Accordingly, while such a technique is appropriate for detection of light such as a laser beam that has strong polarization, it is not appropriate for detecting light such as natural light in which mixed polarized light is included. In addition, although the electric field energy generated in accordance with plasmon resonance is detected in the form of a change in the temperature, a structure is used in which a signal is acquired by averaging the temperature changes. Accordingly, the dynamic range of the detection intensity is narrow, and the technique may be inappropriate in terms of spectroscopy and sensitivity.

As above, in the imaging apparatus, it is difficult to improve the image quality of a captured image due to the occurrence of various defects.

In addition, it is difficult to decrease the thickness of the imaging apparatus, and accordingly, there are cases where it is difficult to miniaturize the apparatus. Furthermore, there are cases where it is difficult to decrease the cost.

Similarly to the pixel of the imaging apparatus, since it is difficult to decrease the thickness of a photovoltaic cell including a photovoltaic device, there are cases where it is difficult to miniaturize the apparatus. In addition, there are cases where it is difficult to decrease the cost.

Thus, it is desirable to provide an imaging apparatus and an electronic apparatus capable of improving the image quality of a captured image and decreasing the size and the cost thereof and a method of manufacturing the apparatuses. In addition, it is desirable to provide a photovoltaic cell capable of decreasing the size and the cost of the apparatus.

An embodiment of the present disclosure is directed to an imaging apparatus including: an imaging unit in which a plurality of pixels receiving incidence light on a light receiving face are disposed in an imaging region of a substrate. The pixel includes a thermocouple device group in which a plurality of thermocouples are aligned along the light receiving face, in the thermocouple device group, the plurality of thermocouples are arranged so as to be separated from each other such that the light receiving face has a grating structure, and the thermocouple device group is disposed such that the incidence light is incident to the grating structure so as to cause plasmon resonance to occur on the light receiving face, and an electromotive force is generated due to a change in the temperature of a portion of the thermocouple device group, at which the plasmon resonance occurs, in each of the plurality of thermocouples.

Another embodiment of the present disclosure is directed to a method of manufacturing an imaging apparatus. The method includes: forming an imaging unit by disposing a plurality of pixels that receive incidence light on a light receiving face in an imaging region of a substrate. The forming of an imaging unit includes forming a thermocouple device group, in which a plurality of thermocouples are aligned along the light receiving face, in the pixel, in the forming of a thermocouple device group, the plurality of thermocouples are arranged so as to be separated from each other such that the light receiving face of the thermocouple device group has a grating structure, and the thermocouple device group is formed such that the incidence light is incident to the grating structure so as to cause plasmon resonance to occur on the light receiving face, and an electromotive force is generated due to a change in the temperature of a portion of the thermocouple device group, at which the plasmon resonance occurs, in each of the plurality of thermocouples.

Still another embodiment of the present disclosure is directed to an electronic apparatus including: an imaging unit in which a plurality of pixels receiving incidence light on a light receiving face are disposed in an imaging region of a substrate. The pixel includes a thermocouple device group in which a plurality of thermocouples are aligned along the light receiving face, in the thermocouple device group, the plurality of thermocouples are arranged so as to be separated from each other such that the light receiving face has a grating structure, and the thermocouple device group is disposed such that the incidence light is incident to the grating structure so as to cause plasmon resonance to occur on the light receiving face, and an electromotive force is generated due to a change in the temperature of a portion of the thermocouple device group, at which the plasmon resonance occurs, in each of the plurality of thermocouples.

Yet another embodiment of the present disclosure is directed to a photovoltaic cell including: a photovoltaic power device that generates an electromotive force by receiving incidence light on a light receiving face. The photovoltaic power device includes a thermocouple device group in which a plurality of thermocouples are aligned along the light receiving face, in the thermocouple device group, the plurality of thermocouples are arranged so as to be separated from each other such that the light receiving face has a grating structure, and the thermocouple device group is disposed such that the incidence light is incident to the grating structure so as to cause plasmon resonance to occur on the light receiving face, and an electromotive force is generated due to a change in the temperature of a portion of the thermocouple device group, at which the plasmon resonance occurs, in each of the plurality of thermocouples.

According to the embodiments of the present disclosure, the thermocouple device group is formed by arranging the plurality of thermocouples so as to be separated from each other such that the light receiving face of the thermocouple device group has a grating structure. Here, the thermocouple device group is formed such that the incidence light is incident to the grating structure so as to cause plasmon resonance to occur on the light receiving face, and an electromotive force is generated due to a change in the temperature of a portion of the thermocouple device group, at which the plasmon resonance occurs, in each of the plurality of thermocouples.

According to the embodiments of the present disclosure, there are provided an imaging apparatus and an electronic apparatus capable of improving the image quality of a captured image and decreasing the size and the cost thereof and a method of manufacturing the apparatuses. In addition, there is provided a photovoltaic cell capable of decreasing the size and the cost of the apparatus.

BRIEF DESCRIPTION OF THE DRAWINGS

FIG. 3 is a diagram illustrating the appearance of the incidence of incidence light onto a grating structure.

FIG. 8 is a top view schematically illustrating the color arrangement of a pixel according to Embodiment 1 of the present disclosure.

FIGS. 9A to 9D are diagrams illustrating main parts of the process of a method of manufacturing an imaging apparatus according to Embodiment 1 of the present disclosure.

FIGS. 10E and 10F are diagrams illustrating main parts of the process of the method of manufacturing the imaging apparatus according to Embodiment 1 of the present disclosure.

FIG. 13K is a diagram illustrating a main part of the process of the method of manufacturing the imaging apparatus according to Embodiment 1 of the present disclosure.

FIG. 16 is a diagram illustrating a main portion of a thermocouple device group according to Modified Example 3 of Embodiment 1.

FIG. 23 is a diagram illustrating a main portion of an imaging device according to Embodiment 5 of the present disclosure.

FIG. 28 is a flowchart illustrating the operation of a cooling process according to Embodiment 7 of the present disclosure.

FIG. 29 is a cross-sectional view illustrating the operation of the cooling process according to Embodiment 7 of the present disclosure.

FIG. 31 is a top view illustrating a main portion of a photovoltaic cell according to Embodiment 9 of the present disclosure.

DETAILED DESCRIPTION

Hereinafter, embodiments of the present disclosure will be described with reference to the accompanying drawings.

The description will be presented in the following order.
0. Basic Configuration
1. Embodiment 1 (Imaging Apparatus)
2. Embodiment 2 (Case Where Upper Face of Thermocouple Device Group Is Coated With Al Film)
3. Embodiment 3 (Case Where Thermocouple Device Group Is Stacked)
4. Embodiment 4 (Case Where Part of Thermocouple Device Group Is Coated With Light Shielding Film)
5. Embodiment 5 (Case Where Nanospring Is Included)
6. Embodiment 6 (Case Where Data Correction Is Made)
7. Embodiment 7 (Case Where Cooling Is Performed Based On Peltier Effect)
8. Embodiment 8 (Imaging Operation)
9. Embodiment 9 (Photovoltaic Cell)
10. Others 0. Basic Configuration FIGS. 1 and 2 are diagrams illustrating main portions of a photo sensor (photovoltaic device) included in a pixel or the like that configures an imaging apparatus according to an embodiment of the present disclosure.

Figure 1:
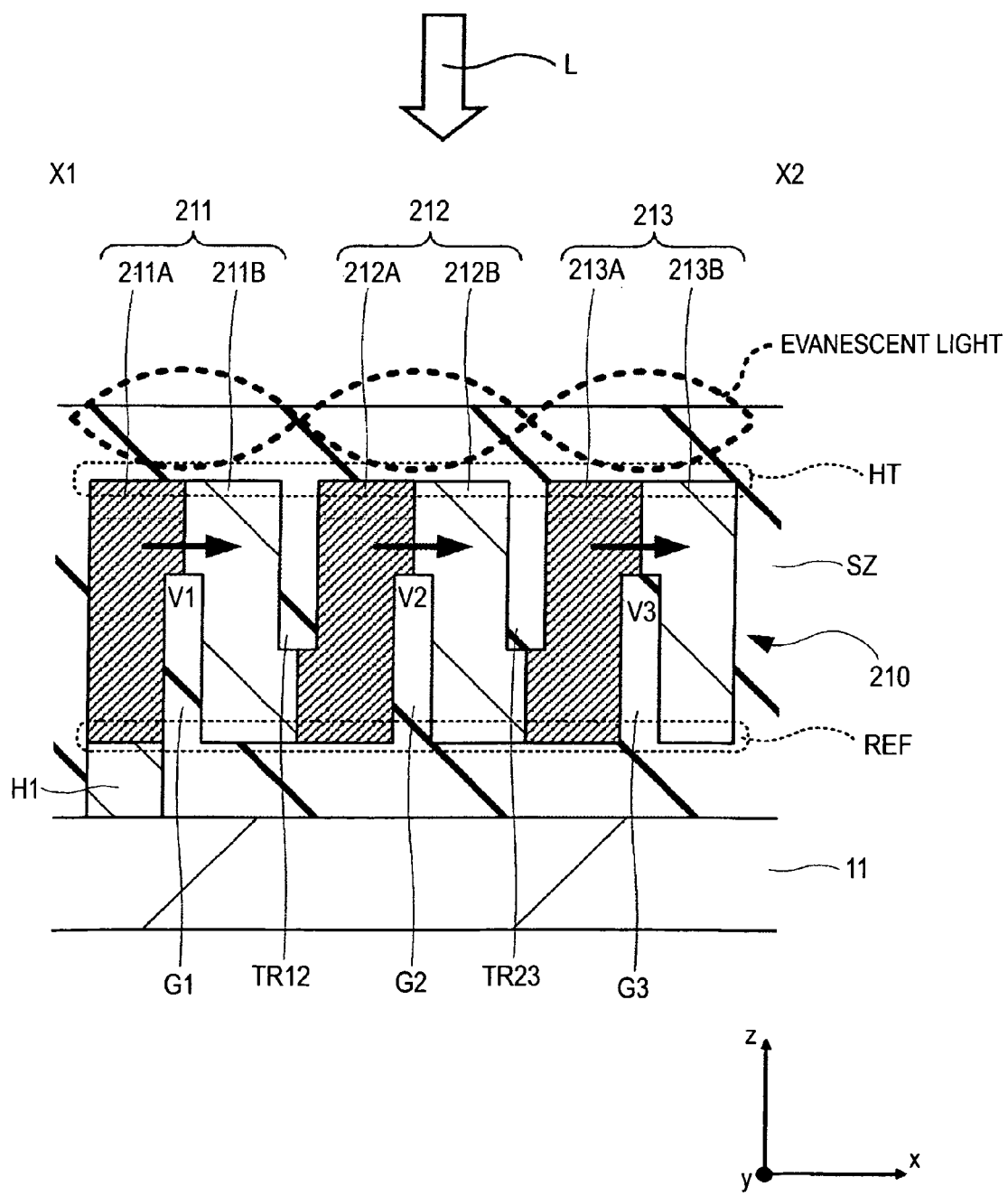
FIG. 1 is a diagram illustrating a main portion of a photo sensor (photovoltaic device) included in a pixel or the like that configures an imaging apparatus according to an embodiment of the present disclosure.

Here, FIG. 1 illustrates a cross section. In addition, FIG. 2 illustrates an upper face. FIG. 1 is a cross-section taken along line X1-X2 shown in FIG. 2 in a case where the line of vision is set from the lower side toward the upper side. Although a cross-section taken along line X1 to X2 shown in FIG. 2 in a case where the line of vision is set from the upper side toward the lower side is not shown in the figure, each portion is disposed in the shape illustrated in FIG. 1.

Figure 2:
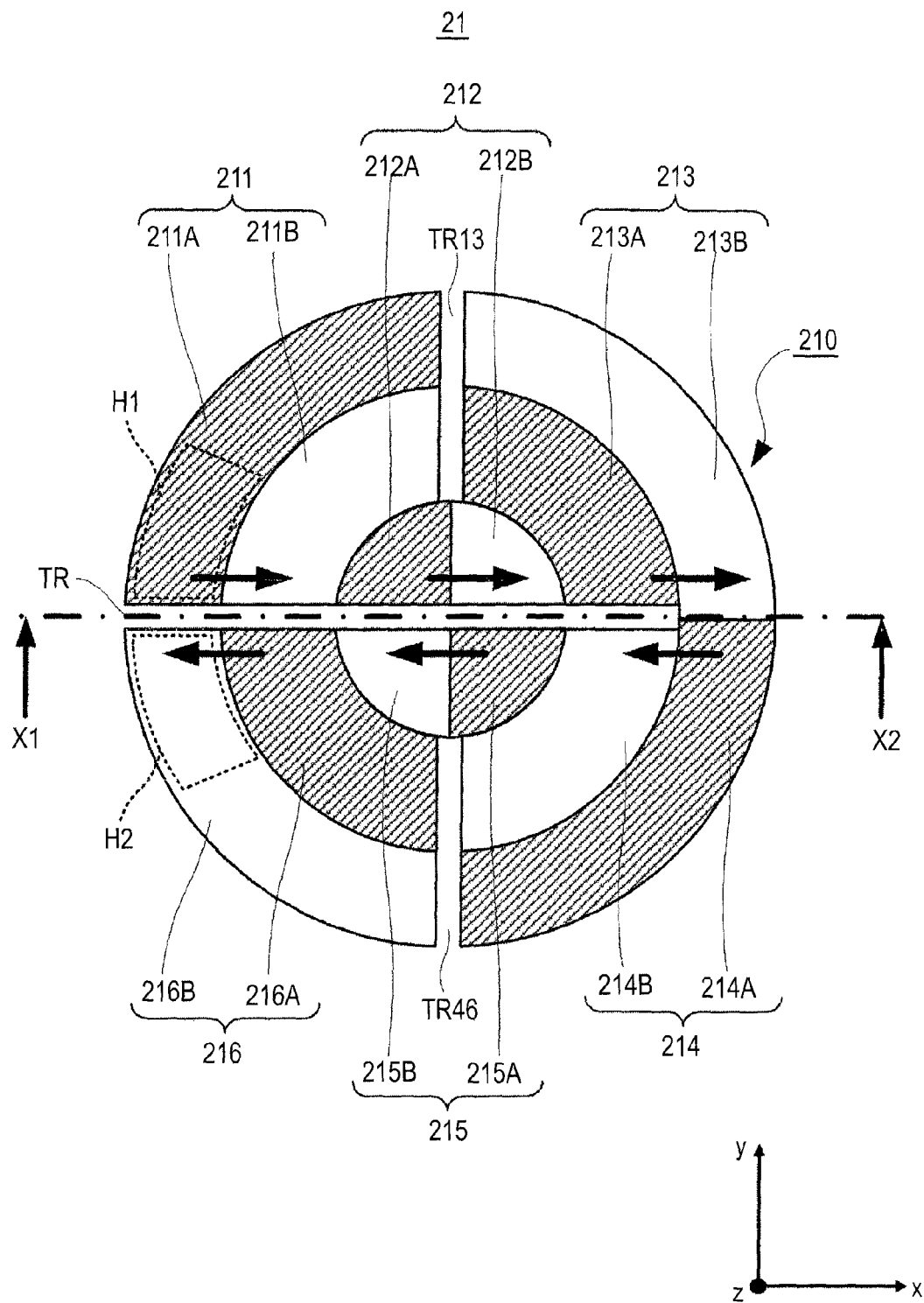
FIG. 2 is a diagram illustrating a main portion of the photo sensor (photovoltaic device) included in a pixel or the like that configures the imaging apparatus according to the embodiment of the present disclosure.

As illustrated in FIGS. 1 and 2, a photo sensor includes a thermocouple device group 210.

As illustrated in FIG. 1, the thermocouple device group 210 is disposed on a face (upper face) of a substrate 11 onto which incidence light L is incident. The periphery of the thermocouple device group 210 is covered with an insulating layer SZ that is, for example, formed from an insulating material such as $SiO_2$. It is preferable that the periphery of the thermocouple device group 210 is covered with a material such as an organic porous film or an air layer that has low thermal conductivity.

As illustrated in FIG. 2, the thermocouple device group 210 is configured by a plurality of thermocouples 211 to 216. For example, in the thermocouple device group 210, six thermocouples including a first thermocouple 211, a second thermocouple 212, a third thermocouple 213, a fourth thermocouple 214, a fifth thermocouple 215, and a sixth thermocouple 216 are disposed.

In the thermocouple device group 210, the plurality of thermocouples 211 to 216, as illustrated in FIGS. 1 and 2, are aligned along the upper face (the xy plane) of the substrate 11. The plurality of thermocouples 211 to 216 are connected in series.

Here, as illustrated in FIGS. 1 and 2, the plurality of thermocouples 211 to 216 respectively include first metal portions 211A to 216A and second metal portions 211B to 216B.

In the plurality of thermocouples 211 to 216, the first metal portions 211A to 216A and the second metal portions 211B to 216B are aligned along the upper face (the xy plane) of the substrate 11 so as to be connected to each other. The first metal portions 211A to 216A and the second metal portions 211B to 216B are formed from metals having different thermoelectric powers such that a thermal electromotive force is generated in each of the thermocouples 211 to 216 based on a Seebeck effect. The first metal portions 211A to 216A and the second metal portions 211B to 216B, for example, are formed from Cu, Al, Ag, Ni, or Fe, or alloys thereof. For example, the first metal portions 211A to 216A are configured so as to serve as negative bridges, and the second metal portions 211B to 216B are configured so as to serve as positive bridges.

In this embodiment, as illustrated in FIGS. 1 and 2, in the thermocouple device group 210, the plurality of thermocouples 211 to 216 are arranged so as to be separated from each other for configuring a grating structure.

In addition, in this embodiment, the thermocouple device group 210 is disposed such that plasmon resonance occurs in accordance with incidence light L incident to the grating structure, and the temperature of a portion at which the plasmon resonance occurs changes so as to generate electromotive forces in the plurality of thermocouples 211 to 216.

In other words, each pixel P has a grating structure that is a convex-concavity in which a light receiving portion and a detection portion are integrated. Here, a grating structure is formed in which the light receiving face (the upper face) of the thermocouple device group 210 is convex and concave such that plasmon resonance occurs on the light receiving face (the upper face) in accordance with light of a specific wavelength band included in the incidence light L. Thus, local thermal energy according to the strengthened electric field of the plasmon resonance (evanescent light generated therefrom) that occurs based on the grating structure is efficiently converted into an electric field difference by the thermocouple device group 210. Accordingly, the detection of the strength of the incidence light (incident electromagnetic wave) or imaging is performed based on a signal acquired based on the electromotive force.

Each portion configuring the thermocouple device group 210 will be described below in detail.

As illustrated in FIG. 1, in the first to third thermocouples 211 to 213 of the thermocouple device group 210, trenches TR12 and TR23 are disposed between the first thermocouple 211 and the second thermocouple 212 and between the second thermocouple 212 and the third thermocouple 213. In addition, as illustrated in FIG. 2, a trench TR 13 is disposed between the first thermocouple 211 and the third thermocouple 213.

As illustrated in FIG. 1, the first thermocouple 211 and the second thermocouple 212 are connected in series on the lower side of the trench TR 21. In addition, the second thermocouple 212 and the third thermocouple 213 are connected in series on the lower side of the trench TR 23.

As above, each of the first to third thermocouples 211 to 213, as illustrated in FIG. 1, the upper ends of the first metal portions 211A to 213A and the upper ends of the second metal portions 211B to 213B are bonded together at the upper side portion at which the incidence light L is incident in the depth direction z of the substrate 11. In other words, in the first to third thermocouples 211 to 213, the first metal portions 211A to 213A and the second metal portions 211B to 213B are bonded together such that the upper side portions become temperature measuring junctions (thermal junctions).

In addition, at the lower side portions of the first to third thermocouples 211 to 213 from which the incidence light L is output, the lower ends of the first metal portions 211A to 213A and the lower ends of the second metal portions 211B to 213B are located, and the lower ends of both parties are separated from each other with gaps G1 to G3 interposed therebetween. In other words, in the first to third thermocouples 211 to 213, the first metal portions 211A to 213A and the second metal portions 211B to 213B are separated from each other such that the lower-side portions become reference junctions (cool junctions).

Furthermore, the second metal portion 211B of the first thermocouple 211 and the first metal portion 212A of the second thermocouple 212 are electrically connected to each other. In addition, the second metal portion 212B of the second thermocouple 212 and the first metal portion 213A of the third thermocouple 213 are electrically connected to each other.

In contrast to this, although the cross-sections of the fourth to sixth thermocouples 214 to 216 are not shown in the figures, a trench (not shown in the figures) are arranged as above between the fourth thermocouple 214 and the fifth thermocouple 215 and between the fifth thermocouple 215 and the sixth thermocouple 216. In addition, as illustrated in FIG. 2, a trench TR 46 is arranged between the fourth thermocouple 214 and the sixth thermocouple 216.

In addition, the fourth thermocouple 214 and the fifth thermocouple 215 are connected in series on the lower side of a trench (not shown in the figure). The fifth thermocouple 215 and the sixth thermocouple 216 are connected in series on the lower side of a trench (not shown in the figure).

In other words, although not shown in the figure, in upperside portions of the fourth to sixth thermocouples 214 to 216, similarly to the first to third thermocouples 211 to 213, the upper ends of the first metal portions 214A to 216A and the upper ends of the second metal portions 214B to 216B are bonded together. In addition, the lower ends of the first metal portions 214A to 216A and the lower ends of the second metal portions 214B to 216B are located on the lower side of the fourth to sixth thermocouples 214 to 216, and the lower ends of both parties are separated from each other with gaps (not shown in the figure) interposed therebetween.

The second metal portion 214B of the fourth thermocouple 214 and the first metal portion 215A of the fifth thermocouple 215 are electrically connected to each other. In addition, the second metal portion 215B of the fifth thermocouple 215 and the first metal portion 216A of the sixth thermocouple 216 are electrically connected to each other.

Furthermore, as illustrated in FIG. 2, a trench TR is arranged between the first thermocouple 211 and the sixth thermocouple 216, between the second thermocouple 212 and the fifth thermocouple 215, and between the third thermocouple 213 and the fourth thermocouple 214. Here, the trench TR is arranged so as to pass through the center of the thermocouple device group 210 and extend in the x direction.

As illustrated on the right side in FIG. 2, the third thermocouple 213 and the fourth thermocouple 214 are connected in series. In other words, the second metal portion 213B of the third thermocouple 213 and the first metal portion 214A of the fourth thermocouple 214 are electrically connected to each other. Although not shown in the figure, the trench TR extends in the x direction on the upper side of a connection portion between the third thermocouple 213 and the fourth thermocouple 214.

In addition, inside of each trench, as illustrated in FIG. 1, an insulating layer SZ is disposed.

As above, in the thermocouple device group 210, a plurality of the thermocouples 211 to 216 are disposed as convex portions, and the trench is disposed as a concave portion such that a plurality of the thermocouples 211 to 216 are separated from each other. Accordingly, the thermocouple device group 210 serves as a diffraction grating based on the concave and convex face that is configured by the convex portions and the concave portion.

Here, as illustrated in FIG. 2, in the thermocouple device group 210, a plurality of the thermocouples 211 to 216 are disposed such that the grating structure has center-point symmetry.

In this embodiment, as illustrated in FIG. 2, the thermocouple device group 210 has a Baumkuchen structure in which the external shape is a circular shape on the light receiving face, and the plurality of thermocouples 211 to 216 are formed to be symmetrical by using the center of the circular shape as its axis.

More specifically, as illustrated in FIG. 2, in the thermocouple device group 210, the planar shape of each of the second thermocouple 212 and the fifth thermocouple 215 is a semicircular shape. The second thermocouple 212 and the fifth thermocouple 215 are aligned in the y direction so as to form a circular shape when being combined.

In contrast to this, the first thermocouple 211, the third thermocouple 213, the fourth thermocouple 214, and the sixth thermocouple 216 have an arc shape as the planar shape thereof. The first thermocouple 211, the third thermocouple 213, the fourth thermocouple 214, and the sixth thermocouple 216 are arranged on the periphery of the second thermocouple 212 and the fifth thermocouple 215, so that the external shape thereof forms a circular shape when they are combined together. The first thermocouple 211 and the third thermocouple 213 are arranged so as to be aligned in the x direction on the upper side of the second thermocouple 212. In addition, the fourth thermocouple 214 and the sixth thermocouple 216 are arranged so as to be aligned in the x direction on the lower side of the fifth thermocouple 215.

In this embodiment, the thermocouple device group 210 is disposed such that the plurality of thermocouples 211 to 216 are located in an amplified electric field area (an area corresponding to an antinode of the amplitude of evanescent light) according to the plasmon resonance occurring on the light receiving face. In other words, each portion is formed such that portions of the plurality of thermocouples 211 to 216 at which the first metal portions 211A to 216A and the second metal portions 211B to 216B are bonded together correspond to portions at which electric fields are locally amplified in accordance with the plasmon resonance.

As illustrated in FIGS. 1 and 2, wirings H1 and H2 are disposed. Here, the wirings H1 and H2 are respectively connected to one end and the other end of each of the plurality of thermocouples 211 to 216 of the thermocouple device group 210 that are connected in series. In addition, the wirings H1 and H2 are connected to logic circuits (not shown in the figures).

In particular, as illustrated in FIG. 1, out of the plurality of thermocouples 211 to 216 connected in series, the wiring H1 is disposed at the lower end of the first metal portion 211A that configures the first thermocouple 211. In addition, the wiring H2 is disposed at the lower end of the second metal portion 216B that configures the sixth thermocouple 216. The wirings H1 and H2, for example, are formed by using a conductive material such as Cu that has low electrical resistance.

In the above-described thermocouple device group 210, when the incident light L is incident to the upper face of the grating structure, the surface plasmon of the upper face is excited. Thus, the upper face portion thereof locally receives thermal energy in accordance with the amplified electric field of the evanescent light generated therein.

Accordingly, in the thermocouple device group 210, as illustrated in FIG. 1, a heat area HT located on the upper face side is heated. In other words, the temperature changes at the temperature measuring junctions of the thermocouple device group 210.

In contrast to this, in the thermocouple device group 210, plasmon resonance does not occur in a reference area REF that is located on the lower face side, and accordingly, the reference area REF is not heated. In other words, the temperature does not change at the reference junction of the thermocouple device group 210.

Accordingly, in the thermocouple device group 210, when the incidence light L is incident, a temperature difference between the heat area HT and the reference area REF occurs, and accordingly, an electromotive force is generated based on the Seebeck effect.

As illustrated in Equation (1), an electromotive force Vi that is represented as a product of a temperature difference (T1−T0) between the Temperature T1 of the heat area HT and the temperature T0 of the reference area REF and a Seebeck coefficient Zc can be acquired in each thermocouple 211 to 216. In the thermocouple device group 210, as represented in the following Equation (2), total power Vtot represented as a sum of electromotive forces Vi acquired in the plurality of thermocouples 211 to 216 can be acquired.

$$Vi = Zc(T1-T0) \quad (1)$$

$$Vtot = \Sigma Vi \ (i=1,2,3,\ldots,n) \quad (2)$$

More specifically, as illustrated in FIG. 1, in the first to third thermocouples 211 to 213, electromotive forces V1, V2, and V3 are generated, and currents flow from the first metal portions 211A to 213A to the second metal portions 211B to 213B. As illustrated in FIG. 2, in the fourth to sixth thermocouples 214 to 216, similarly, electromotive forces are generated, and currents flow. In other words, a current flows along the direction of the arrangement of the first to sixth thermocouples 211 to 216.

Figure 4:
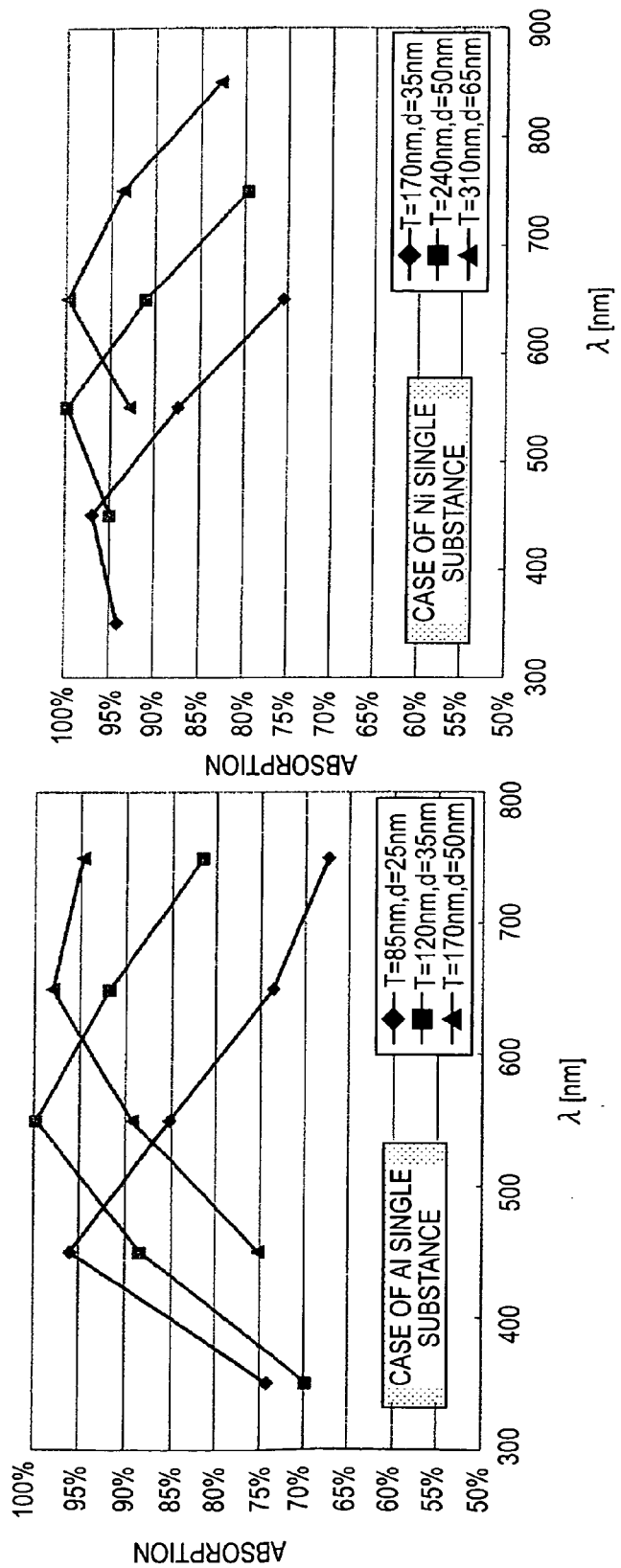
FIGS. 4A and 4B are diagrams illustrating the appearance of the incidence of incidence light onto a grating structure.

FIGS. 3, 4A, and 4B are diagrams illustrating the appearance of the incidence of incidence light onto a grating structure.

FIG. 3 is a cross-sectional view. FIG. 3 illustrates the appearance of the incidence of incident light through a $SiO_2$ layer onto a grating structure made from metal (Ni or Al) in which convex portions having a predetermined height d are disposed on the light receiving face at a predetermined pitch T.

FIGS. 4A and 4B are diagrams illustrating simulation results. FIGS. 4A and 4B illustrate the results of simulations of the relation between the wavelength of light and the amount of absorption thereof in a case where incidence light is incident onto the grating structure illustrated in FIG. 3. FIG. 4A illustrates a case where the grating structure is formed from a single substance of Al, and FIG. 4B illustrates a case where the grating structure is formed from a single substance of Ni. Here, the results of simulations performed by using a two-dimensional FDTD (Finite-difference-Time-Domain) method are illustrated.

As can be understood from FIGS. 4A and 4B, by appropriately setting the aspect ratio of the concavo-convexity of the grating structure, light of a specific wavelength band can be selectively detected. In addition, in accordance with a difference of materials (permittivity), light of a specific wavelength band can be selectively detected.

1. Embodiment 1

A. Apparatus Configuration (A-1) Configuration of Main Portion of Camera

Figure 5:
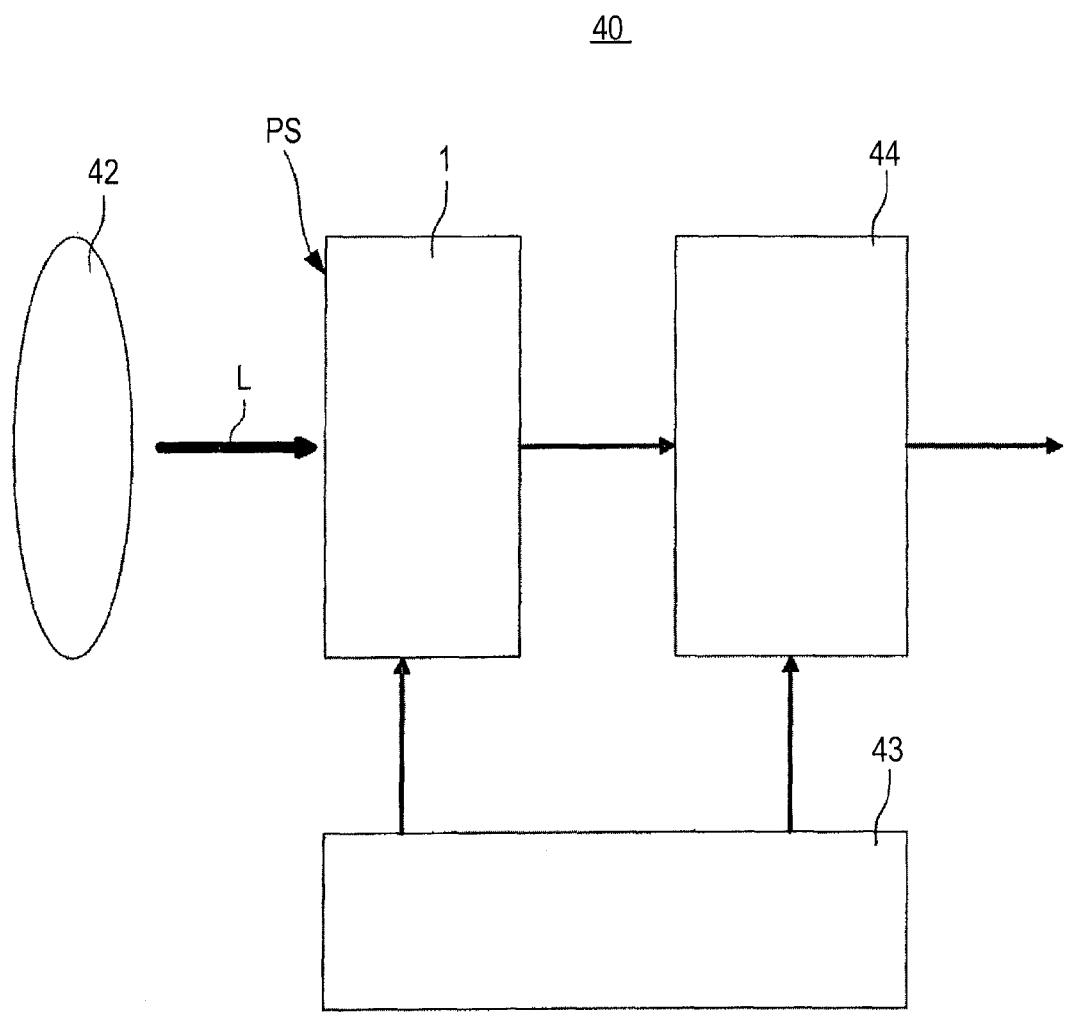
FIG. 5 is a configuration diagram illustrating the configuration of a camera according to Embodiment 1 of the present disclosure.

FIG. 5 is a configuration diagram illustrating the configuration of a camera 40 according to Embodiment 1 of the present disclosure.

As illustrated in FIG. 5, the camera 40 includes an imaging device 1, an optical system 42, a control unit 43, and a signal processing unit 44. The units will be sequentially described.

The imaging device 1 receives incidence light L that is incident onto an imaging face PS as a subject image through an optical system 42 and generates a signal. Here, the imaging device 1 is driven in accordance with a control signal that is output from the control unit 43 and outputs a signal.

The optical system 42 includes optical members such as an imaging lens and a diaphragm and is arranged so as to collect the incidence light L onto the imaging face PS of the imaging device 1.

The control unit 43 outputs various control signals to the imaging device 1 and the signal processing unit 44 so as to control the imaging device 1 and the signal processing unit 44 to be driven. The control unit 43 includes a computer that operates as a control unit based on a program.

The signal processing unit 44 generates a captured image of a subject image by performing signal processing for the signal output from the imaging device 1. The signal processing unit 44 includes a computer that operates as a signal processing unit based on a program.

(A-2) Configuration of Main Portion of Imaging Device

Now, the entire configuration of the imaging device 1 will be described.

Figure 6:
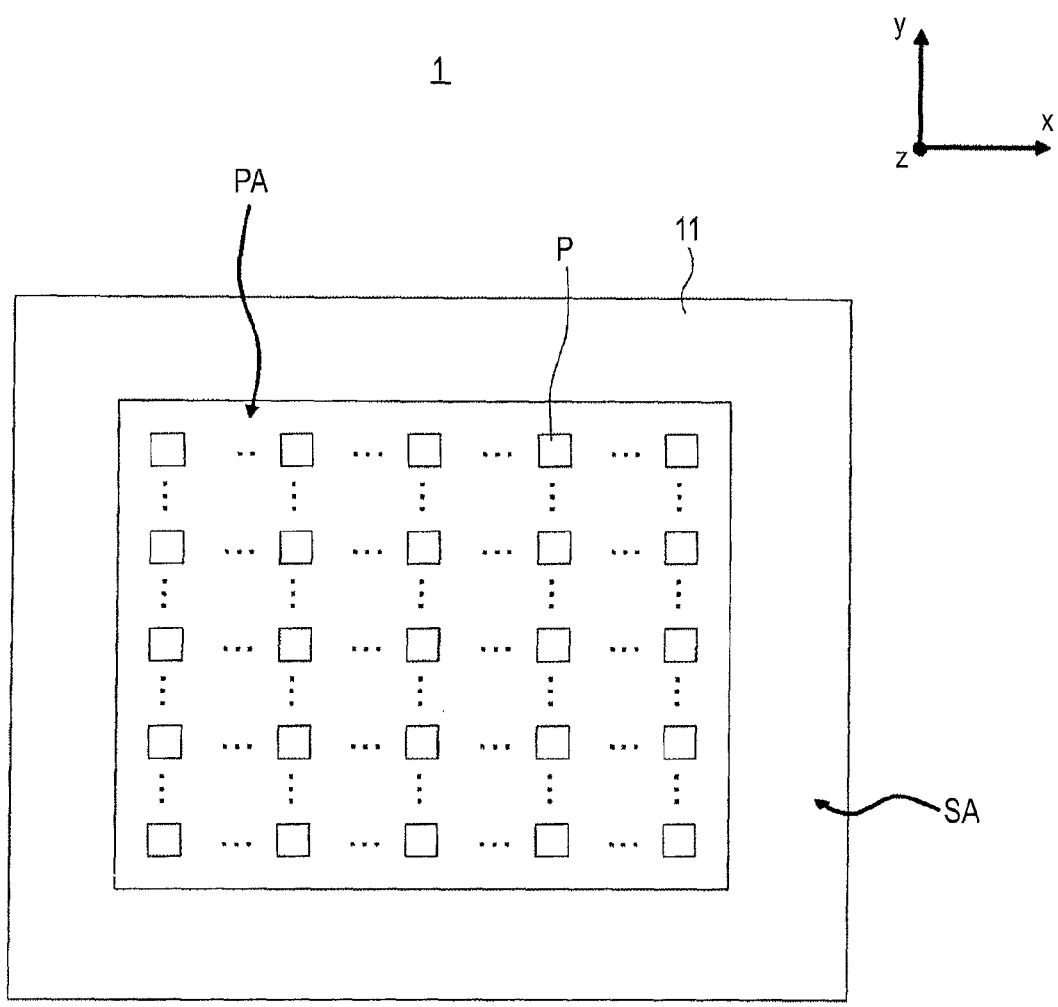
FIG. 6 is a diagram illustrating the entire configuration of an imaging device according to Embodiment 1 of the present disclosure.

FIG. 6 is a diagram illustrating the entire configuration of the imaging device 1 according to Embodiment 1 of the present disclosure. FIG. 6 illustrates the upper face.

As illustrated in FIG. 6, the imaging device 1 includes a substrate 11. The substrate 11, for example, is a semiconductor substrate that is configured by a silicon semiconductor, and an imaging region PA and a peripheral region SA are arranged on a face of the substrate 11.

The imaging region PA, as illustrated in FIG. 6, has a rectangular shape, and a plurality of pixels P are arranged in the horizontal direction x and the vertical direction y. In other words, the pixels P are aligned in a matrix pattern. The pixel P will be described in detail later. This imaging region PA corresponds to the imaging face PS illustrated in FIG. 1.

The peripheral region SA, as illustrated in FIG. 6, is located on the periphery of the imaging region PA. Although not shown in the figure, peripheral circuits are disposed in the peripheral region SA.

For example, a driving circuit that drives each pixel P positioned in the imaging region PA and an external output circuit that outputs a signal generated by each pixel P to the outside thereof are disposed as the peripheral circuits.

(A-3) Detailed Configuration of Imaging Device

The imaging device 1 according to this embodiment will be described in detail.

Figure 7:
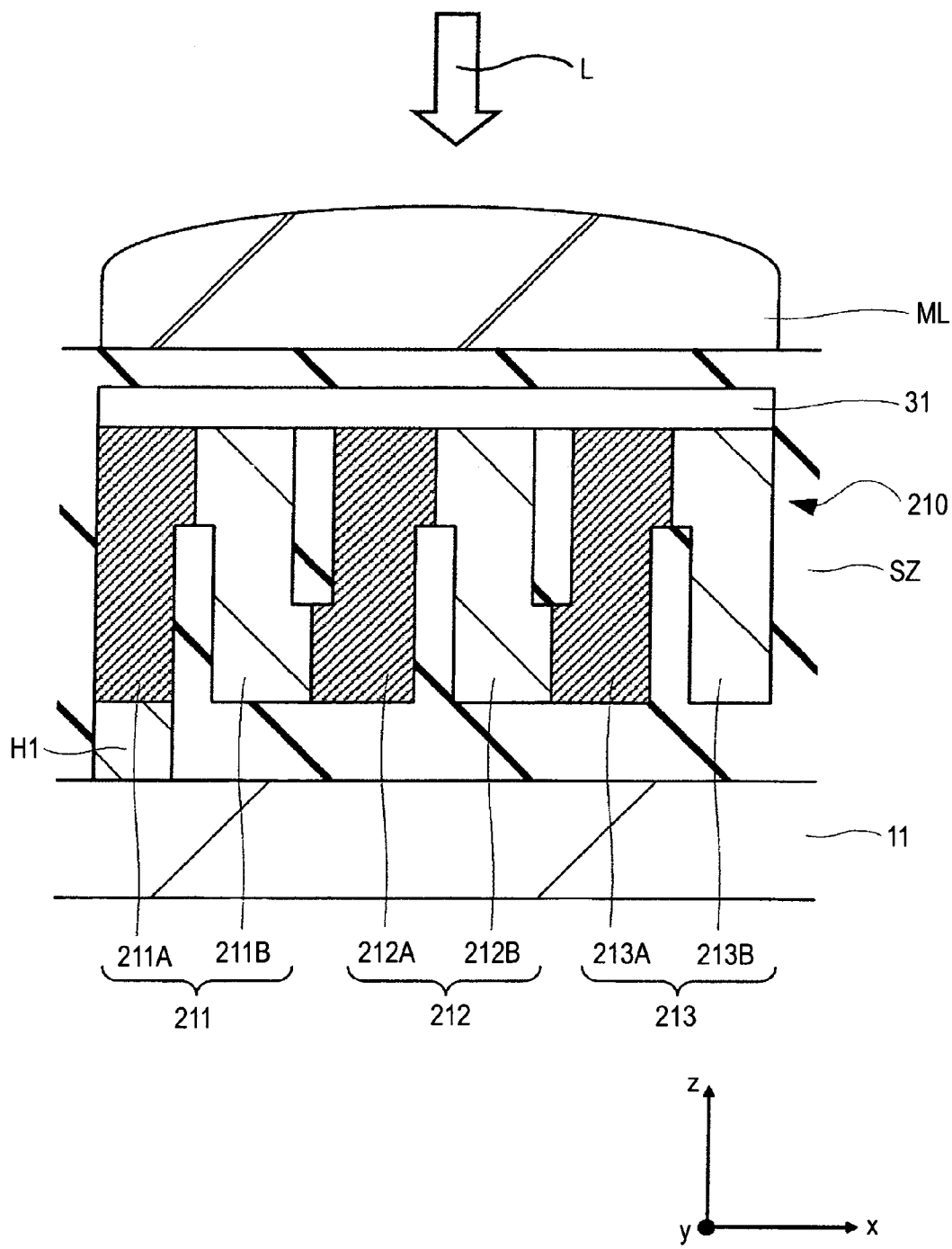
FIG. 7 is a diagram illustrating a main portion of the imaging device according to Embodiment 1 of the present disclosure.

FIG. 7 is a diagram illustrating a main portion of the imaging device 1 according to Embodiment 1 of the present disclosure. FIG. 7 schematically illustrates a cross-section of the pixel P. FIG. 7 represents the same cross-section as that illustrated in FIG. 1.

As illustrated in FIG. 7, in the imaging device 1, the pixel P includes a thermocouple device group 210. In addition, an air gap layer 31 and a micro-lens ML are disposed in correspondence with each pixel P.

The thermocouple device group 210, as illustrated in FIG. 7, is disposed on an upper face of the substrate 11 that is located on a side onto which the incidence light L is incident. The periphery of the thermocouple device group 210 is covered with an insulating layer SZ that is formed of an insulating material such as $SiO_2$.

Although the upper face is not shown in the figure, the thermocouple device group 210 is configured similarly to the case illustrated in FIG. 2.

In other words, similarly to the description presented above, in the thermocouple device group 210, a plurality of thermocouples 211 to 216 are arranged to be separated from each other for forming a grating structure. In addition, the thermocouple device group 210 is disposed such that plasmon resonance occurs on the light receiving face in accordance with the incidence light L incident to the grating structure, and electromotive forces are generated by a plurality of thermocouples 211 to 216 in accordance with a change in the temperature of parts of the light receiving face (see FIG. 2).

For example, in the plurality of thermocouples 211 to 216, first metal portions 211A to 216A and second metal portions 211B to 216B are formed from Ni, and an alloy of Ni and Cu. Other than that, various metal materials may be selected and used as a combination from which a Seebeck effect appropriately occurs.

An air gap layer 31, as illustrated in FIG. 7, is an air gap and is disposed on the upper face of the thermocouple device group 210. The upper face of the air gap layer 31 is coated with an insulating layer SZ such as $SiO_2$. In other words, the air gap layer 31 is formed so as to be interposed between the upper face onto which the incidence light L is incident and the insulating layer SZ in the thermocouple device group 210.

Alternatively, a vacuum layer may be disposed as an air gap instead of the air gap layer 31 that includes air.

The micro-lens ML, as illustrated in FIG. 7, is disposed on the upper face of the insulating layer SZ that covers the thermocouple device group 210. The micro-lens ML is a convex-type lens in which the center is formed thicker than the edge and is configured so as to collect the incidence light L on the upper face of the thermocouple device group 210.

FIG. 8 is a top view schematically illustrating the color arrangement of the pixel P according to Embodiment 1 of the present disclosure.

As illustrated in FIG. 8, the imaging device 1 includes a red pixel R that selectively receives red light, a green pixel G that selectively receives green light, and a blue pixel B that selectively receives blue light. The imaging device 1 captures a color image based on signals acquired from the red pixel R, the green pixel G, and the blue pixel B.

As illustrated in FIG. 8, the red pixel R, the green pixel G, and the blue pixel B are disposed so as to be adjacent to one another. Here, the red pixel R, the green pixel G, and the blue pixel B are arranged so as to be aligned in a Bayer pattern.

More specifically, a plurality of the green pixels G are aligned in a diagonal direction so as to be in a checkered pattern. In addition, the red pixel R and the blue pixel B are arranged in a diagonal direction between the plurality of the green pixels G. For example, each of the pixels is formed to have a pixel size of 1.4 μm and a film thickness of 1.0 μm.

Each of the red pixel R, the green pixel G, and the blue pixel B, as described above, includes the thermocouple device group 210.

In the red pixel R, in order to selectively receive red light and output a signal, the thermocouple device group 210 is configured so as to form a periodical structure of the concave and convex portions, for example, in which the height of the convex portion is 55 nm, and the pitch is 180 nm.

In the green pixel G, in order to selectively receive green light and output a signal, the thermocouple device group 210 is configured so as to form a periodical structure of the concave and convex portions, for example, in which the height of the convex portion is 35 nm, and the pitch is 120 nm.

In the blue pixel B, in order to selectively receive blue light and output a signal, the thermocouple device group 210 is configured so as to form a periodical structure of the concave and convex portions, for example, in which the height of the convex portion is 25 nm, and the pitch is 90 nm.

In addition, in the thermocouple device group 210, a "maximum gap of the concave and convex portions" is equal to or less than the maximum wavelength of light to be detected.

Accordingly, in the red pixel R, the "maximum gap of the concave and convex portions", for example, is equal to or less than 700 nm.

In the green pixel G, the "maximum gap of the concave and convex portions", for example, is equal to or less than 600 nm.

In the blue pixel B, the "maximum gap of the concave and convex portions", for example, is equal to or less than 500 nm.

Here, the "gap of the concave and convex portions" represents a distance (pitch width) between a convex portion and another convex portion or a concave portion and another concave portion.

In addition, the number of thermocouples may be appropriately set in the thermocouple device group 210. By increasing the number of thermocouples, the sensitivity can be improved.

B. Manufacturing Method

Hereinafter, a main part of a method of manufacturing the above-described imaging apparatus will be described.

FIGS. 9A to 13K are diagrams illustrating main parts of the process of a method of manufacturing an imaging apparatus, according to Embodiment 1 of the present disclosure. FIG. 9A to FIG. 13K represent the same cross-sections as that illustrated in FIG. 7. The imaging device 1 illustrated in FIG. 7 or the like is manufactured sequentially through the processes illustrated in FIGS. 9A to 13K.

In FIGS. 9A to 13K, out of the plurality of thermocouples 211 to 216 configuring the thermocouple device group 210, a part for forming the first to third thermocouples 211 to 213 is represented. Although the process for manufacturing the fourth to sixth thermocouples 214 to 216 is not shown in the figure, it is the same as that for manufacturing the first to third thermocouples 211 to 213.

(a) Forming Insulating Layer SZ1

In order to manufacture an imaging device 1, first, as illustrated in FIG. 9A, an insulating layer SZ1 is formed.

Here, the insulating layer SZ1 is formed by forming a film with $SiO_2$ on the upper face of a substrate 11 that is formed from a silicon semiconductor by using a CVD method. For example, the insulating layer SZ1 is formed such that the film thickness thereof is equal to or less than 100 nm.

(b) Forming Wiring H1

Next, a wiring H1 is formed as illustrated in FIG. 9B.

Here, after a trench is formed in a portion of the insulating layer SZ1 in which the wiring is formed H1, a conductive material is buried in the trench, thereby forming the wiring H1.

For example, the trench is formed in the insulating layer SZ1 by performing a dry etching process. Then, by depositing a metal material such as Cu, for example, by using a sputtering method, the wiring H1 is formed. In addition, a wiring H2 is formed through the same process as that described above.

(c) Forming Insulating Layer SZ2

Next, as illustrated in FIG. 9C, an insulating layer SZ2 is formed.

Here, the insulating layer SZ2 is formed by forming a film with $SiO_2$ on the upper face of the insulating layer SZ1 by using a CVD method. For example, the insulating layer SZ2 is formed such that the film thickness of a combination of the insulating layer SZ1 and the insulating layer SZ2 is equal to or less than 200 nm.

(d) Processing Pattern of Insulating Layer SZ2

Next, as illustrated in FIG. 9D, pattern processing is performed for the insulating layer SZ2.

Here, the pattern of the insulating layer SZ2 is processed such that areas (see FIGS. 1 and 7) of the lower portions of the thermocouples 211 to 216 that configure the thermocouple device group 210, in which lower horizontal portions following the upper face of the substrate 11 are to be formed, are removed.

For example, the pattern of the insulating layer SZ2 is processed by performing a dry etching process. Accordingly, a trench is formed at a portion corresponding to the lower horizontal portion of each one of the thermocouples 211 to 216.

(e) Forming First Metal Layer 21A

Next, as illustrated in FIG. 10E, a first metal layer 21A is formed.

Here, inside each trench formed in the previous process, a mask pattern PM1 is formed. The mask pattern PM1 is formed such that a face of a portion of the lower portion of each one of the thermocouples 211 to 216 that configure the thermocouple device group 210, in which one of the second metal portions 211B to 216B is formed, is laminated, and the face of a portion thereof, in which one of the first metal portions 211A to 216A is to be formed, is exposed. This mask pattern PM1 is formed by processing a photoresist film by using a photolithographic technique.

Then, a metal material is formed as a film on the upper face of the insulating layer SZ2 and the mask pattern PM1 such that the metal material is buried inside the trench in which the mask pattern PM1 is provided. Here, the same metal material as that of the first metal portions 211A to 216A configuring the thermocouples 211 to 216 is formed as a film.

Thereafter, for example, by performing a CMP process, the upper faces of the insulating layer SZ2 and the mask pattern PM1 are exposed, thereby forming the first metal layer 21A.

(f) Forming Second Metal Layer 22B

Next, as illustrated in FIG. 10F, a second metal layer 22B is formed.

Here, after the mask pattern PM1 is removed from the inside of the trench, a metal material is formed as a film on the upper faces of the insulating layer SZ2 and the first metal layer 21A such that the metal material is buried inside the trench. Here, the same metal material as that of the second metal portions 211B to 216B that configure the thermocouples 211 to 216 is formed as a film.

Thereafter, for example, by performing a CMP process, the upper faces of the insulating layer SZ2 and the mask pattern PM1 are exposed, thereby forming the second metal layer 22B.

(g) Forming Insulating Layer SZ3

Figure 11G:
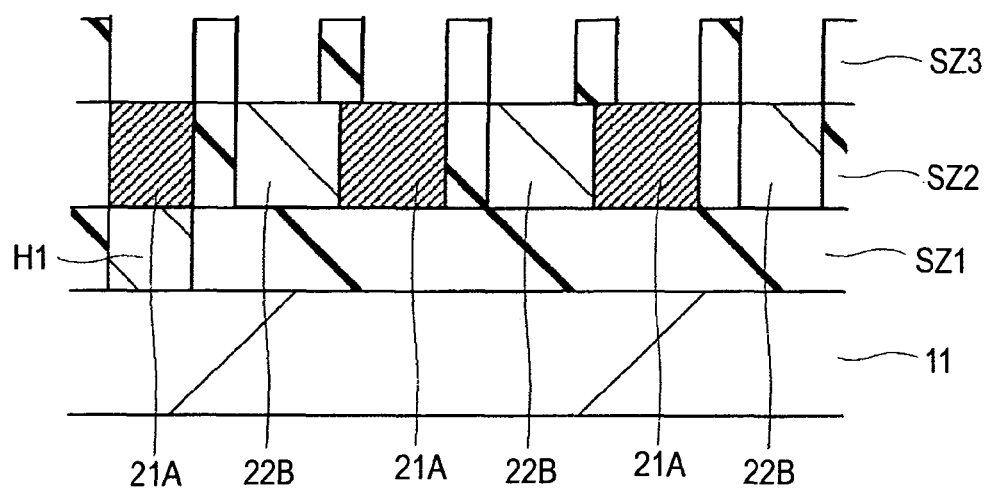
FIGS. 11G and 11H are diagrams illustrating main parts of the process of the method of manufacturing the imaging apparatus according to Embodiment 1 of the present disclosure.

Next, as illustrated in FIG. 11G, an insulating layer SZ3 is formed.

Here, by forming a film with $SiO_2$ on the upper face of the insulating layer SZ2 by using a CVD method, the insulating layer SZ3 is formed. For example, the insulating layer SZ3 is formed such that the film thickness thereof is equal to or less than 100 nm.

Then, the pattern of the insulating layer SZ3 is processed.

Here, the pattern of the insulating layer SZ3 is processed such that areas (see FIGS. 1 and 7), in which vertical portions vertical to the upper face of the substrate 11 are formed, of the thermocouples 211 to 216 configuring the thermocouple device group 210 are removed.

For example, the pattern of the insulating layer SZ3 is processed by performing a dry etching process for the insulating layer SZ3. Accordingly, a trench is formed at a portion corresponding to the vertical portion of each one of the thermocouples 211 to 216.

(h) Forming Third Metal Layer 23A

Figure 11H:
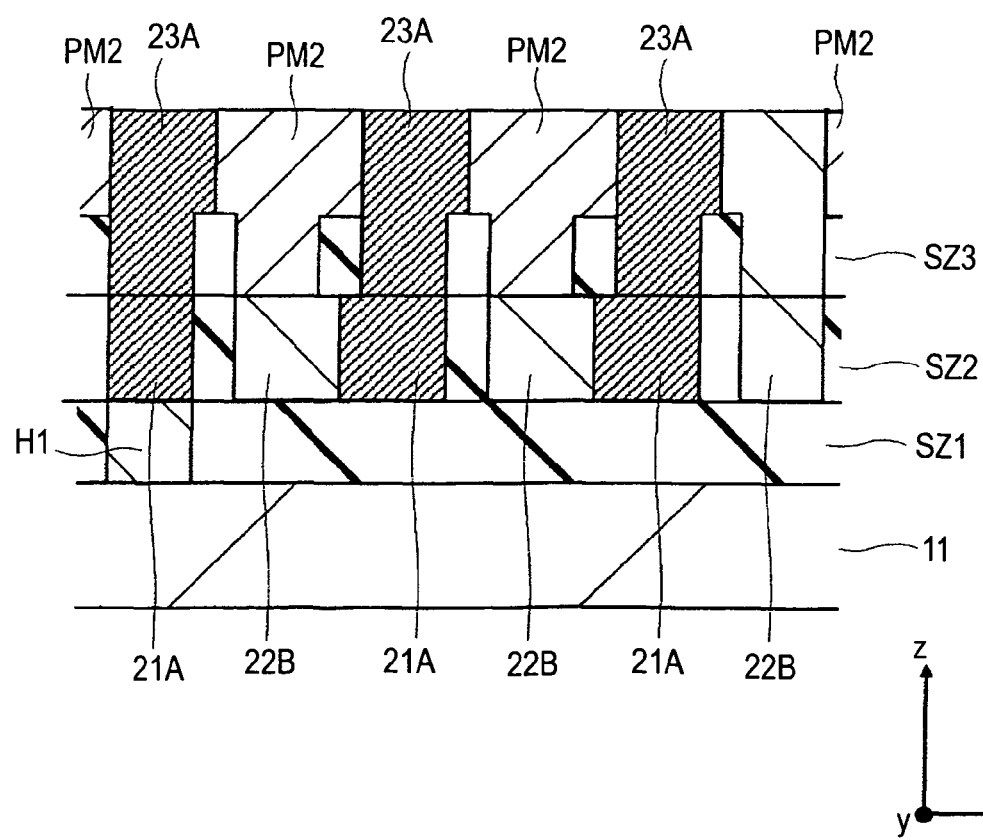

Next, as illustrated in FIG. 11H, a third metal layer 23A is formed.

Here, before the third metal layer 23A is formed, a mask pattern PM2 is formed. The mask pattern PM2 is formed such that, out of the trenches formed in the previous process, the mask patterns are buried in trenches of portions, which form the second metal portions 211B to 216B, of the thermocouples 211 to 216, and faces of portions forming the first metal portions 211A to 216A are exposed. In addition, on the upper face of the insulating layer SZ3, the faces of portions that form the second metal portions 211B to 216B of the thermocouples 211 to 216 are coated, and the faces of portions that form the first metal portions 211A and 216A are exposed. Similarly, the mask pattern PM2 is formed. By processing the photoresist film by using the photolithographic technique, this mask pattern PM2 is formed.

Then, a metal material is formed as a film on the upper faces of the insulating layer SZ3 and the mask pattern PM2 such that a metal material is buried inside the trench of the mask pattern PM2. Here, the same metal material as that of the first metal portions 211A to 216A configuring the thermocouples 211 to 216 is formed as a film.

Thereafter, for example, by performing a CMP process, the upper face of the mask pattern PM2 is exposed, thereby forming the third metal layer 23A.

(j) Forming Fourth Metal Layer 24B

Figure 12I:
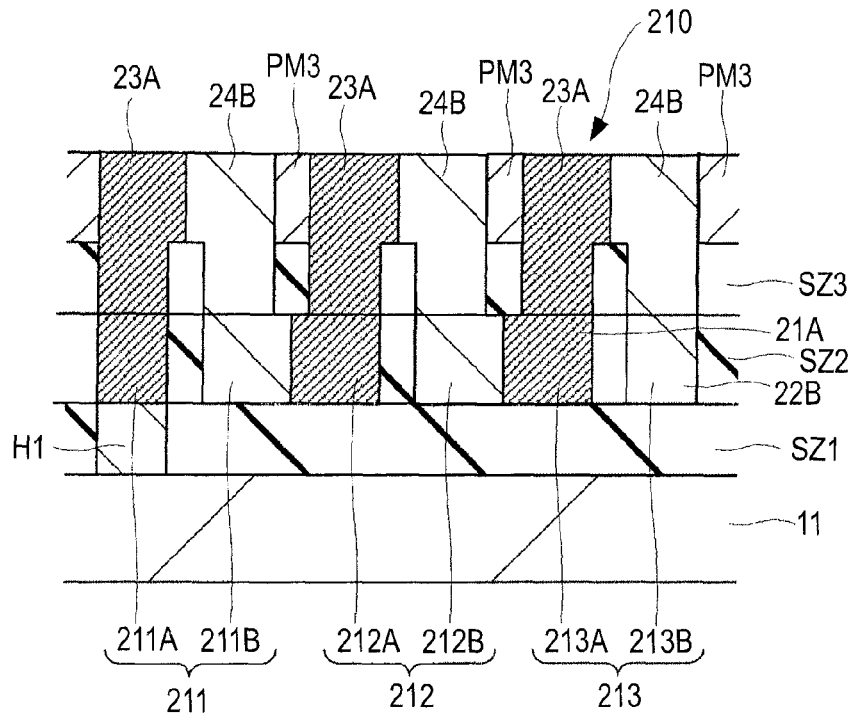
FIGS. 12I and 12J are diagrams illustrating main parts of the process of the method of manufacturing the imaging apparatus according to Embodiment 1 of the present disclosure.

Next, as illustrated in FIG. 12I, a fourth metal layer 24B is formed.

Here, before the fourth metal layer 24B is formed, the mask pattern PM2 is removed. Then, a mask pattern PM3 is formed. The mask pattern PM3 is formed such that, of the upper face of the insulating layer SZ3, faces of portions that form the second metal portions 211B to 216B of the thermocouples 211 to 216 are exposed, and other portions are coated. By processing a photoresist film using a photolithographic technique, this mask pattern PM3 is formed.

Then, a metal material is formed as a firm on the upper faces of the insulating layer SZ3 and the third metal layer 23A such that the metal material buried inside the trench disposed in the insulating layer SZ3 and the mask pattern PM3. Here, the same metal material as that of the second metal portions 211B to 216B configuring the thermocouples 211 to 216 is formed as a film.

Thereafter, for example by performing a CMP process, the upper face of the third metal layer 23A is exposed, thereby forming the fourth metal layer 24B.

Figure 12J:
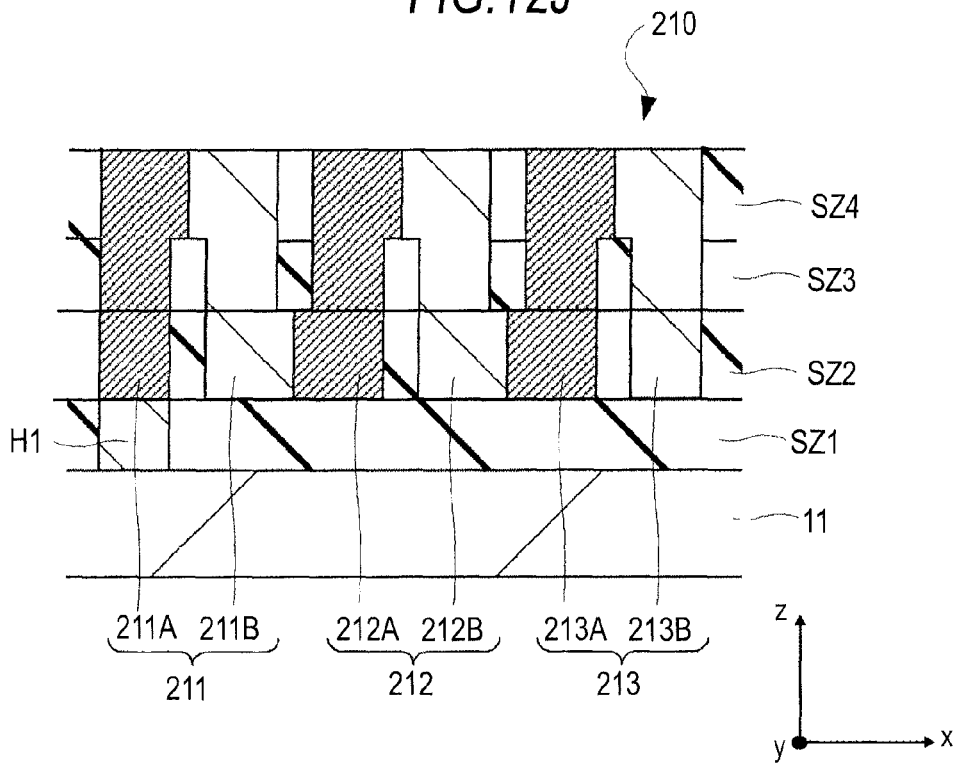

Accordingly, as illustrated in FIGS. 12I and 12J, the thermocouples 211 to 216 are formed by using the first metal layer 21A, the second metal layer 22B, the third metal layer 23A, and the fourth metal layer 24B.

(j) Forming Insulating Layer SZ4

Next, as illustrated in FIG. 12J, an insulating layer SZ4 is formed.

Here, before the insulating layer SZ4 is formed, the mask pattern PM3 is removed. Then, $SiO_2$ is buried in a portion in which the mask pattern PM3 is removed by using a CVD method, whereby the insulating layer SZ4 is formed.

(k) Forming Air Gap Layer 31

Next, as illustrated in FIG. 13K, an air gap layer 31 is formed.

Here, an insulating layer SZ5 is disposed on one face of another substrate 11Z. For example, a film is formed with $SiO_2$ by using a CVD method such that the film thickness is equal to or less than 100 nm, whereby the insulating layer SZ5 is formed.

Then, a portion of the insulating layer SZ5 that forms the air gap layer 31 is removed, whereby a trench is formed in the insulating layer SZ5. For example, by performing a dry etching process for the insulating layer SZ5 such that the depth thereof is equal to or less than 30 nm, whereby the trench is formed in the insulating layer SZ5.

Thereafter, the face of the substrate 11Z on which the insulating layer SZ5 is bonded to the face of the substrate 11 on which the insulating layer SZ4 is disposed.

This bonding process is performed in a low-pressure (equal to or 100 mT) environment.

Accordingly, the insulating layer SZ is disposed such that the periphery of the thermocouples 211 to 216 are coated by a plurality of the insulating layers SZ1 to SZ5.

The bonding process may be performed as below.

First, a sacrifice layer (organic-based material) is formed on the right upper side of the grating, and thereafter, a film is formed with $SiO_2$ by using a film forming method such as a CVD method. Next, a $O_2$ ashing process is performed with a plurality of holes opened through dry etching, whereby the sacrifice layer disposed on the lower layer is removed.

Finally, the holes are closed with film that does not have good coverage. For example, by depositing an oxide film by using a PVD method, the holes are closed.

In the above-described process, for example, in order to perform an etching process for the $SiO_2$ film, a CCP (Capacitive Coupled Plasma) Etching Device is used.

More specifically, the process is performed in the following etching conditions.

gas type and flow rate: $C_4F_8/O_2/Ar=11/8/400$ sccm
pressure: 30 mT
power applied to upper portion: 1500 W
power applied to lower portion: 1500 W
etching time: 120 s
RF frequency: upper portion/lower portion=60 MHz/13.56 MHz In addition, the processing condition and a used apparatus (an ICP (Inductive Coupled Plasma), an ECR (Electron Cyclotron Resonance), or the like other than the CCP) are not limited thereto.

(l) Forming Micro-Lens ML

Next, as illustrated in FIG. 7, a micro-lens ML is formed.

Here, the substrate 11Z (see FIG. 13K) is removed, whereby the upper face of the insulating layer SZ is exposed. Thereafter, the micro-lens ML is formed on the upper face of the insulating layer SZ.

For example, the micro-lens ML is formed by pattern-processing a photosensitive resin film by using a photolithographic technique and deforming the lens shape through a reflow process. Other than that, the micro-lens ML may be formed by forming a resist film having a lens shape on a film formed of a lens material and then performing an etchback process for the resist film.

C. Statistics

As above, according to the imaging device 1 of this embodiment, the pixel P includes the thermocouple device group 210 in which a plurality of the thermocouples 211 to 216 are aligned along the light receiving face. In the thermocouple device group 210, a plurality of the thermocouples 211 to 216 are arranged so as to be separated from each other such that the light receiving face forms a grating structure. In addition, plasmon resonance occurs on the light receiving face in accordance with the incidence light L that is incident to the grating structure. Accordingly, the temperature of the portion of the thermocouple device group 210 onto which the incident light L is incident changes, whereby electromotive forces are generated in the plurality of the thermocouples 211 to 216 (see FIGS. 1, 2, and 7).

Thus, according to this embodiment, photoelectric conversion in the semiconductor layer is not used, but signals are acquired based on the electromotive forces. Accordingly, the image quality is prevented from being degraded due to generation of a white point (white scratch) in a captured image. In addition, based on the plasmon resonance that occurs on the grating surface, a locally amplified electric field energy is used, whereby high sensitivity can be realized. Furthermore, it is difficult to generate a mixed color before and after the reception of the incidence light L, and accordingly, a vivid color tone can be reproduced.

Accordingly, the image quality of the captured image can be improved.

In addition, according to this embodiment, spectroscopy can be performed by the grating without using any color filter, whereby the thickness of the entire apparatus can be decreased in an easy manner. In addition, the generation of a mixed color can be suppressed.

Furthermore, in this embodiment, ion injection of impurities is not necessary in the formation of the thermocouple device group 210. Accordingly, the cost, the number of processes, and the number of simulation evaluation processes can be decreased in an easy manner.

Other than the above-described advantages, according to this embodiment, the insulating layer SZ is disposed on the upper face of the thermocouple device group 210 onto which the incidence light L is incident, and the air gap layer 31 is interposed between the upper face onto which the incidence light L is incident and the insulating film. The air gap layer 31 is an air gap and has thermal conductivity that is lower than the thermocouple device group 210. Accordingly, in this embodiment, the air gap layer 31 can block the heat that is transferred from the heat area HT of the thermocouple device group 210 to the outside thereof. Therefore, in the plurality of thermocouples 211 to 216, electromotive forces are generated with high efficiency, thereby high sensitivity can be realized more appropriately (see FIGS. 1, 2, and 7).

According to this embodiment, in the thermocouple device group 210, the plurality of thermocouples 211 to 216 are disposed such that the grating structure has center-point symmetry on the light receiving face (see FIG. 2). Accordingly, light in which various polarization components are mixed can be detected without depending on the polarization of the incidence light L, thereby realizing high sensitivity.

According to this embodiment, in each of the plurality of thermocouples 211 to 216, the first metal portions 211A to 216A and the second metal portions 211B to 216B having difference thermoelectric powers are aligned along the light receiving face. Then, in each of the plurality of thermocouples 211 to 216, one end of each one of the first metal portions 211A to 216A and one end of each one of the second metal portions 211B to 216B are bonded together on the side on which the incidence light L is incident in the depth direction z of the substrate 11. In addition, on a side from which the incidence light L is output, the other end of each one of the first metal portions 211A to 216A and the other end of each one of the second metal portions 211B to 216B are located. Accordingly, in this embodiment, the temperature measuring junctions of the thermocouples 211 to 216 are aligned on the light receiving face, and the light receiving face is not occupied by the reference junction, whereby higher sensitivity can be realized.

In this embodiment, the thermocouple device group 210 is disposed such that the plurality of thermocouples 211 to 216 are located in an amplified electric field area formed by plasmon resonance occurring on the light receiving face. Accordingly, in this embodiment, much higher sensitivity can be realized in an easy manner.

D. Modified Examples

For the thermocouple device group 210, various forms other than those described above can be applied. The modified examples thereof are illustrated as below.

Modified Example 1

Figure 14:
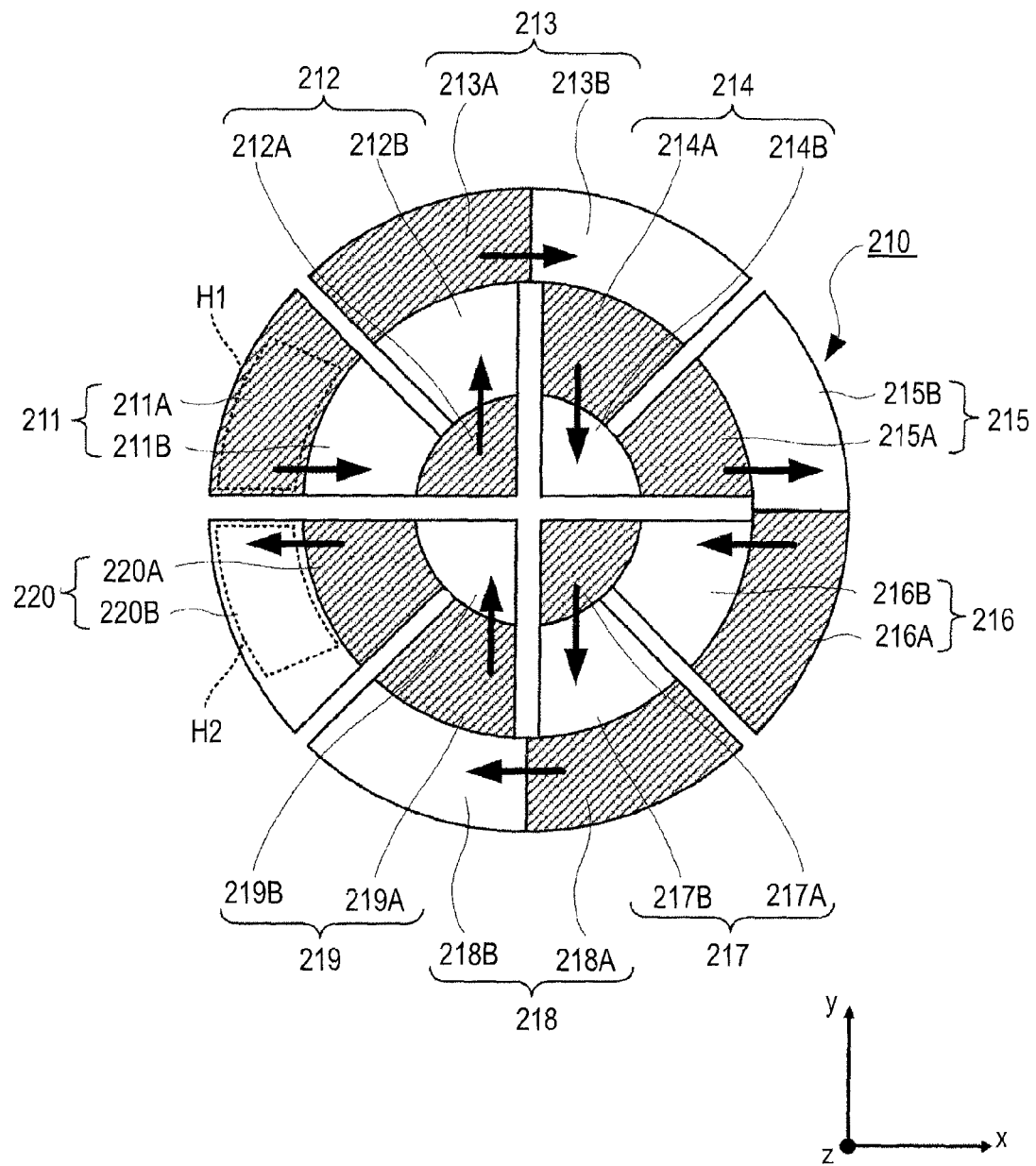
FIG. 14 is a diagram illustrating a main portion of a thermocouple device group according to Modified Example 1 of Embodiment 1.

FIG. 14 is a diagram illustrating a main portion of a thermocouple device group 210 according to Modified Example 1 of Embodiment 1 of the present disclosure. FIG. 14, similarly to FIG. 2, schematically illustrates the upper face. The cross-section is similar to that illustrated in FIG. 1.

As illustrated in FIG. 14, in this modified example, the thermocouple device group 210 is configured by a plurality of thermocouples 211 to 220. Here, ten thermocouples including first to tenth thermocouples 211 to 220 are disposed. As above, in this embodiment, the thermocouples more than those of the above-described Embodiment 1 are included. Except for this point and other points relating to this point, this modified example is the same as the above-described Embodiment 1. Thus, duplicate description will be appropriately omitted.

As illustrated in FIG. 14, in the thermocouple device group 210, a plurality of the thermocouples 211 to 220 are aligned along the upper face (xy plane) of the substrate 11 and are connected in series.

As illustrated in FIG. 14, the plurality of thermocouples 211 to 220 include first metal portions 211A to 220A and second metal portions 211B to 220B and are bonded together.

According to this modified example, in the thermocouple device group 210, the plurality of thermocouples 211 to 220 are arranged so as to be separated from each other for configuring a grating structure. In other words, although the cross-section is not shown in the figure, in the thermocouple device group 210, the plurality of thermocouples 211 to 220 are disposed as convex portions, and trenches are disposed as concave portions between the plurality of thermocouples 211 to 220.

In addition, in the thermocouple device group 210, the plurality of thermocouples 211 to 220 are disposed such that the grating structure has center-point symmetry. Here, the thermocouple device group 210 has a Baumkuchen structure in which the external shape is a circular shape on the light receiving face, and the plurality of thermocouples 211 to 220 are formed to be symmetrical by using the center of the circular shape as its axis.

As illustrated in FIG. 14, wirings H1 and H2 are disposed. Here, the wirings H1 and H2 are respectively connected to one end and the other end of each of the plurality of thermocouples 211 to 220 of the thermocouple device group 210 that are connected in series. In addition, the wirings H1 and H2 are connected to logic circuits (not shown in the figures).

In addition, the thermocouple device group 210 is disposed such that plasmon resonance occurs in accordance with incidence light L incident to the grating structure, and the temperature of a portion at which the plasmon resonance occurs changes so as to generate electromotive forces in the plurality of thermocouples 211 to 220.

More specifically, as denoted by thick arrows shown in FIG. 14, in the first to tenth thermocouples 211 to 220, electromotive forces are generated, and currents flow. In other words, a current flows along the direction of the arrangement of the first to tenth thermocouples 211 to 220.

In this modified example, the number of the thermocouples is larger than that according to the above-described Embodiment 1. Accordingly, the detection sensitivity can be improved further.

Modified Example 2

Figure 15:
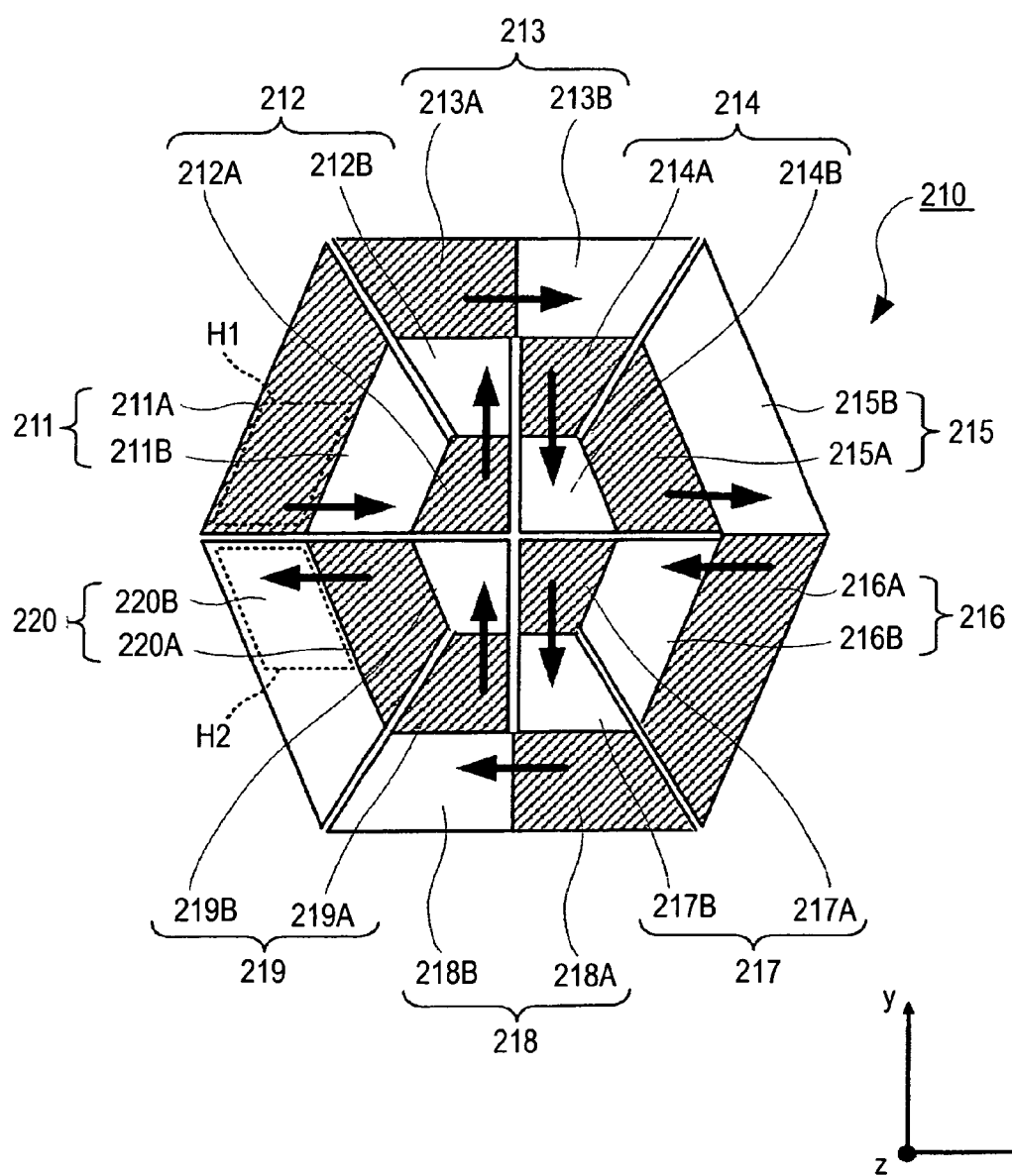
FIG. 15 is a diagram illustrating a main portion of a thermocouple device group according to Modified Example 2 of Embodiment 1.

FIG. 15 is a diagram illustrating a main portion of a thermocouple device group 210 according to Modified Example 2 of Embodiment 1 of the present disclosure. FIG. 15, similarly to FIG. 2, schematically illustrates the upper face. The cross-section is similar to that illustrated in FIG. 1.

As illustrated in FIG. 15, according to this modified example, in the thermocouple device group 210, similarly to that of Modified Example 1, ten thermocouples including first to tenth thermocouples 211 to 220 are disposed. However, in this modified example, the external shape of the thermocouple device group 210 on the light receiving face is different from that of Modified Example 1. Except for this point and other points relating to this point, this modified example is the same as the above-described Embodiment 1. Thus, duplicate description will be appropriately omitted.

As illustrated in FIG. 15, in the thermocouple device group 210, similarly to the above-described Modified Example 1, a plurality of the thermocouples 211 to 220 are aligned along the upper face (xy plane) of the substrate 11 and are connected in series.

In the thermocouple device group 210, the plurality of thermocouples 211 to 220 are arranged so as to be separated from each other for configuring a grating structure. In other words, although the cross-section is not shown in the figure, in the thermocouple device group 210, the plurality of thermocouples 211 to 220 are disposed as convex portions, and trenches are disposed as concave portions between the plurality of thermocouples 211 to 220.

In addition, in the thermocouple device group 210, the plurality of thermocouples 211 to 220 are disposed such that the grating structure has center-point symmetry. Here, differently from Modified Example 1, the thermocouple device group 210 has an external shape that is a polygon on the light receiving face, and the plurality of thermocouples 211 to 220 are formed to be symmetrical by using the center of the polygon as its axis.

More specifically, the external shape of the thermocouple device group 210 is formed to have an external shape of a hexagonal honeycomb structure.

As illustrated in FIG. 15, wirings H1 and H2 are disposed. Here, the wirings H1 and H2 are respectively connected to one end and the other end of each of the plurality of thermocouples 211 to 220 of the thermocouple device group 210 that are connected in series. In addition, the wirings H1 and H2 are connected to logic circuits (not shown in the figures).

In addition, the thermocouple device group 210 is disposed such that plasmon resonance occurs in accordance with incidence light L incident to the grating structure, and the temperature of a portion at which the plasmon resonance occurs changes so as to generate electromotive forces in the plurality of thermocouples 211 to 220.

More specifically, as denoted by thick arrows shown in FIG. 15, in the first to tenth thermocouples 211 to 220, electromotive forces are generated, and currents flow. In other words, a current flows along the direction of the arrangement of the first to tenth thermocouples 211 to 220.

In this modified example, the number of the thermocouples is larger than that according to the above-described Embodiment 1. Accordingly, the detection sensitivity can be improved further.

Modified Example 3

Figure 17:
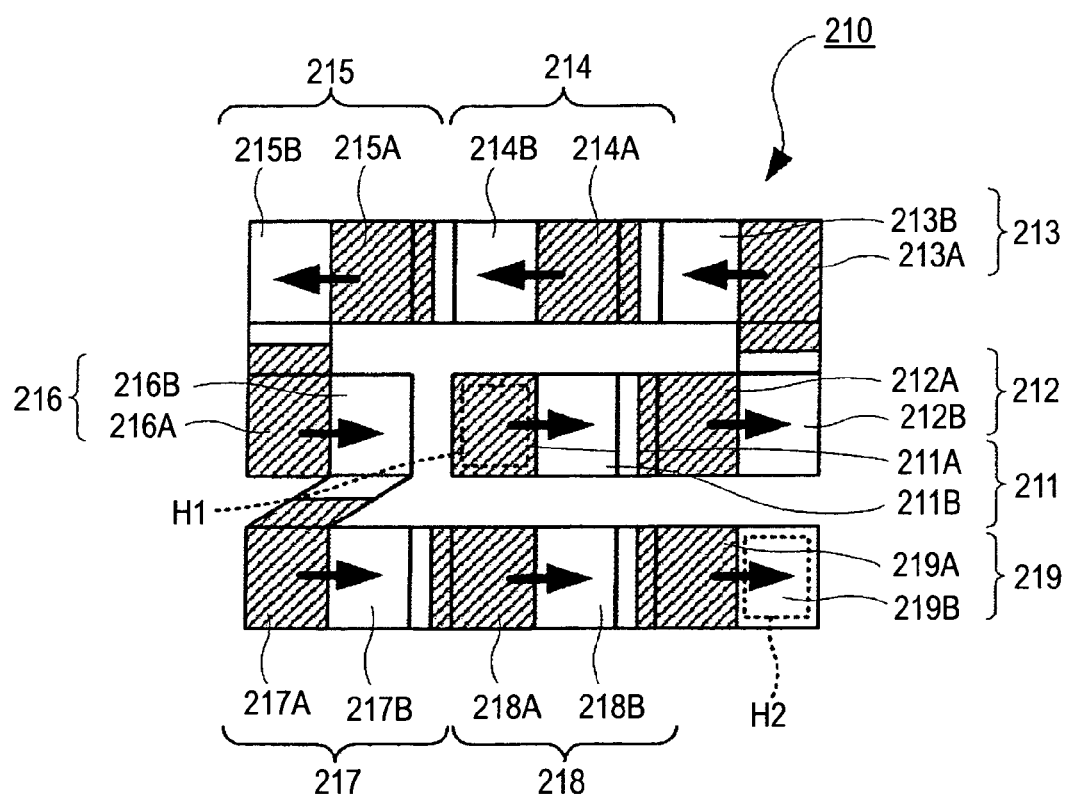
FIG. 17 is a diagram illustrating a main portion of the thermocouple device group according to Modified Example 3 of Embodiment 1.

FIGS. 16 and 17 are diagrams illustrating a main portion of a thermocouple device group 210 according to Modified Example 3 of Embodiment 1 of the present disclosure. FIGS. 16 and 17, similarly to FIG. 2, schematically illustrate the upper face. FIG. 16 illustrates a plurality of thermocouples 211 to 219 that configure a thermocouple device group 210. In addition, in FIG. 17, the connection relation between the plurality of thermocouples 211 to 219 is illustrated together with the plurality of thermocouples 211 to 219. The cross-section is similar to that illustrated in FIG. 1.

As illustrated in FIG. 16, according to this modified example, the thermocouple device group 210 is configured by the plurality of thermocouples 211 to 219. Here, nine thermocouples including first to ninth thermocouples 211 to 219 are disposed. As above, in this modified example, the thermocouples more than those of the above-described Embodiment 1 are included. In addition, the shape and the arrangement of the thermocouples 211 to 219 are different from those of Embodiment 1. Except for this point and other points relating to this point, this modified example is the same as the above-described Embodiment 1. Thus, duplicate description will be appropriately omitted.

As illustrated in FIG. 16, in the thermocouple device group 210, a plurality of the thermocouples 211 to 219 are aligned along the upper face (xy plane) of the substrate 11.

According to this modified example, in the thermocouple device group 210, the plurality of thermocouples 211 to 219 are arranged so as to be separated from each other for configuring a grating structure. In other words, the plurality of thermocouples 211 to 219 are disposed as convex portions, and trenches are disposed as concave portions between the plurality of thermocouples 211 to 219. In addition, in the thermocouple device group 210, the plurality of thermocouples 211 to 219 are disposed such that the grating structure has center-point symmetry.

Here, the plurality of thermocouples 211 to 219, as illustrated in FIG. 16, have a respective rectangular upper face and are disposed in a matrix patter in the x direction and the y direction.

More specifically, the thermocouple device group 210 has a structure in which three thermocouples are aligned in the x direction at a predetermined pitch, and three thermocouples are aligned in the y direction at a predetermined pitch. The first thermocouple 211 is arranged on the center, and other thermocouples 212 to 219 are arranged so as to be symmetrical in the x direction, the y direction, and a direction tilted with respect to the x direction and the y direction.

As illustrated in FIG. 16, the plurality of thermocouples 211 to 219 include first metal portions 211A to 219A and second metal portions 211B to 219B. In the plurality of thermocouples 211 to 219, the first metal portions 211A to 219A and the second metal portions 211B to 219B are arranged so as to be aligned in the x direction and are respectively bonded together.

As illustrated in FIG. 17, the plurality of thermocouples 211 to 219, similarly to Embodiment 1, are connected in series. In other words, the plurality of thermocouples 211 to 219 are connected in series in the lower portion in the thickness direction z.

More specifically, the first thermocouple 211 located on the center is connected in series to the second thermocouple 212 that is located to the right side thereof. In addition, the second thermocouples 212 is connected in series to the third thermocouple 213 located on the upper side. Furthermore, the third thermocouple 213 is connected in series to the fourth thermocouple 214 that is located to the left side thereof. In addition, the fourth thermocouple 214 is connected in series to the fifth thermocouple 215 that is located to the left side thereof. The fifth thermocouple 215 is connected in series to the sixth thermocouple 216 that is located on the lower side. In addition, the sixth thermocouple 216 is connected in series to the seventh thermocouple 217 that is located on the lower side thereof. Furthermore, the seventh thermocouple 217 is connected in series to the eighth thermocouple 218 that is located to the right side thereof. In addition, the eighth thermocouple 218 is connected in series to the ninth thermocouple 219 that is located to the right side thereof.

As illustrated in FIGS. 16 and 17, wirings H1 and H2 are disposed. Here, the wirings H1 and H2 are respectively connected to one end and the other end of each of the plurality of thermocouples 211 to 219 of the thermocouple device group 210 that are connected in series. In addition, the wirings H1 and H2 are connected to logic circuits (not shown in the figures).

In addition, the thermocouple device group 210 is disposed such that plasmon resonance occurs in accordance with incidence light L incident to the grating structure, and the temperature of a portion at which the plasmon resonance occurs changes so as to generate electromotive forces in the plurality of thermocouples 211 to 219.

More specifically, as denoted by thick arrows shown in FIG. 17, in the first to ninth thermocouples 211 to 219, electromotive forces are generated, and currents flow. In other words, a current flows along the direction of the arrangement of the first to ninth thermocouples 211 to 219.

In this modified example, the number of the thermocouples is larger than that according to the above-described Embodiment 1. Accordingly, the detection sensitivity can be improved further.

2. Embodiment 2

A. Apparatus Configuration

Figure 18:
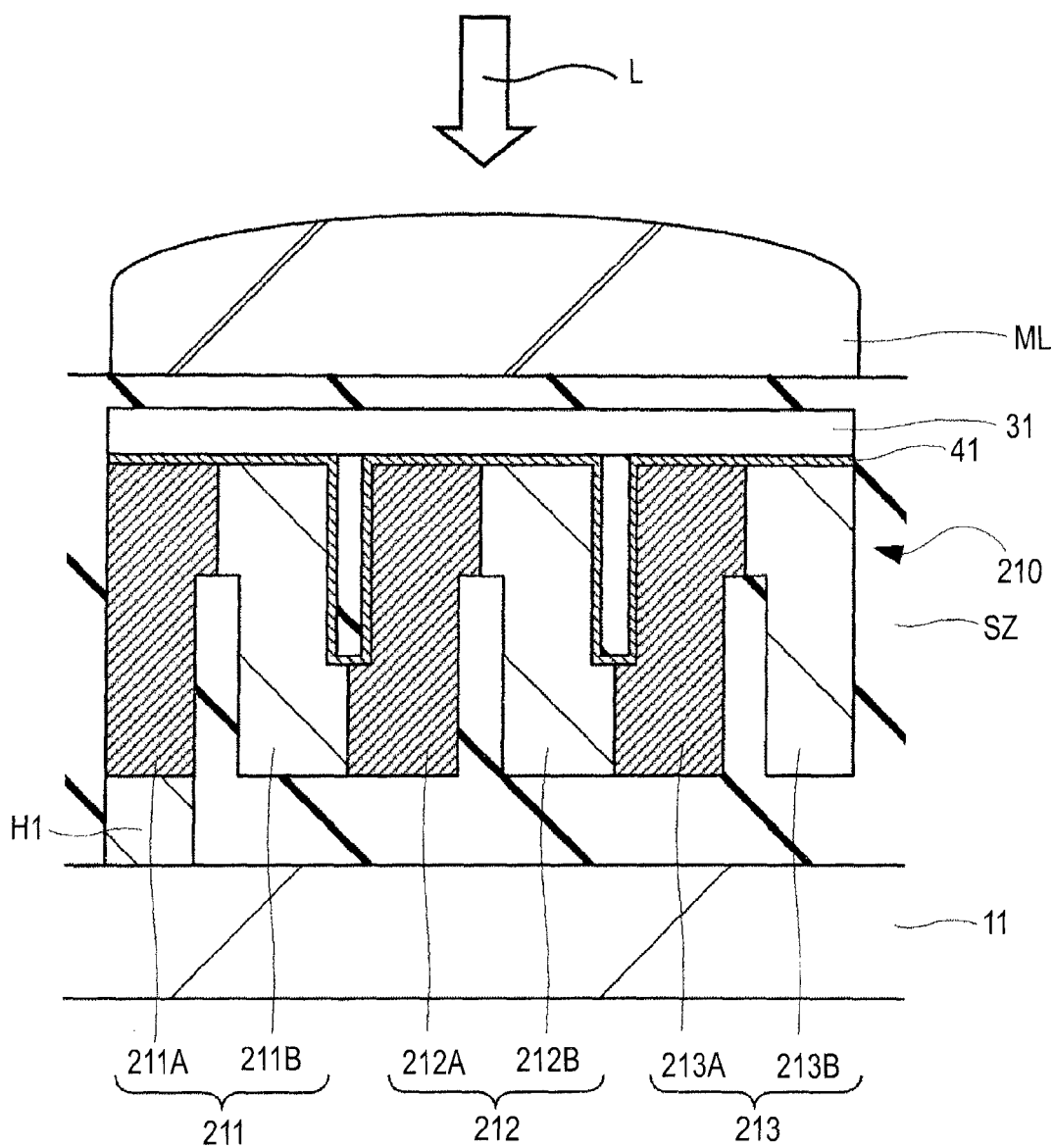
FIG. 18 is a diagram illustrating a main portion of an imaging device according to Embodiment 2 of the present disclosure.

FIG. 18 is a diagram illustrating a main portion of an imaging device according to Embodiment 2 of the present disclosure.

FIG. 18 schematically illustrates the cross-section of the pixel P. FIG. 18 represents the same cross-section as that illustrated in FIG. 1.

As illustrated in FIG. 18, in this embodiment, a metal film 41 is disposed. Except for this point, this embodiment is the same as the above-described Embodiment 1. Thus, duplicate description will be appropriately omitted.

As illustrated in FIG. 18, the thermocouple device group 210 is disposed on the upper face of the substrate 11 onto which incident light L is incident. Although detailed illustration is omitted in the figure, the thermocouple device group 210 is configured similarly to that illustrated in FIGS. 1 and 2.

The metal film 41, as illustrated in FIG. 18, is formed such that the upper face of the thermocouple device group 210 onto which the incidence light L is incident is coated with the metal film 41. Here, a grating structure is formed in which the upper face is concave and convex, and the upper face is coated with the metal film 41.

The metal film 41 is formed by using metal in which plasmon resonance according to the incidence light L can occur more easily than in first metal portions 211A to 216A and second metal portions 211B to 216B that configure thermocouples 211 to 216 (see FIG. 2). The metal film 41, for example, is formed by forming a film with aluminum using a sputtering method. The metal film 41, for example, is formed so as to have a thickness of 30 nm.

The metal film 41 may be formed by using metal other than aluminum in accordance with the period of concave and convex portions.

The plasmon resonance occurs in a case where the distribution relation of the evanescent wave coincides with that of surface plasmon. In other words, in a case where there is a concave and convex structure (period L), the following equation is satisfied.

$$(w/c) \times \sin\theta = (w/c)(e1 \ast e2)/(e1+e2))0.5 + 2\pi/L$$

(here, w: frequency, c: light speed, θ: incidence angle, e1 and e2: real parts of permittivity of medium (air gap layer 31) and metal (metal film 41).

Accordingly, in the above-described condition illustrated in FIGS. 4A and 4B, as the metal film 41, although it is preferable to use metal that has a real part of permittivity that is similar to that of aluminum, metal other than aluminum may be preferably used depending on the frequency of the concave and convex portions.

B. Statistics

As above, according to this embodiment, the thermocouple device group 210 is configured such that, similarly to Embodiment 1, the incidence light L is incident to the light receiving face of the grating structure, the plasmon resonance occurs so as to change the temperature of that portion, and an electromotive force is generated. Accordingly, in this embodiment, similarly to Embodiment 1, various advantages such as prevention of the degradation of the image quality due to generation of a white point (white scratch) in the captured image can be acquired.

In addition, in this embodiment, as described above, the upper face of the thermocouple device group 210 onto which the incidence light is incident is coated with the metal film 41 formed from metal in which the plasmon resonance can be easily generated based on the incidence light L. Accordingly, when the incidence light L is incident, the plasmon resonance occurs in the metal film 41, and heat generated based on the plasmon resonance is distributed in the metal film 41.

In this embodiment, in the metal film 41, since the plasmon resonance occurs more easily than in the case of Embodiment 1, high sensitivity can be realized in an easy manner.

Accordingly, the image quality of a captured image can be further improved.

3. Embodiment 3

A. Apparatus Configuration and the Like

Figure 19:
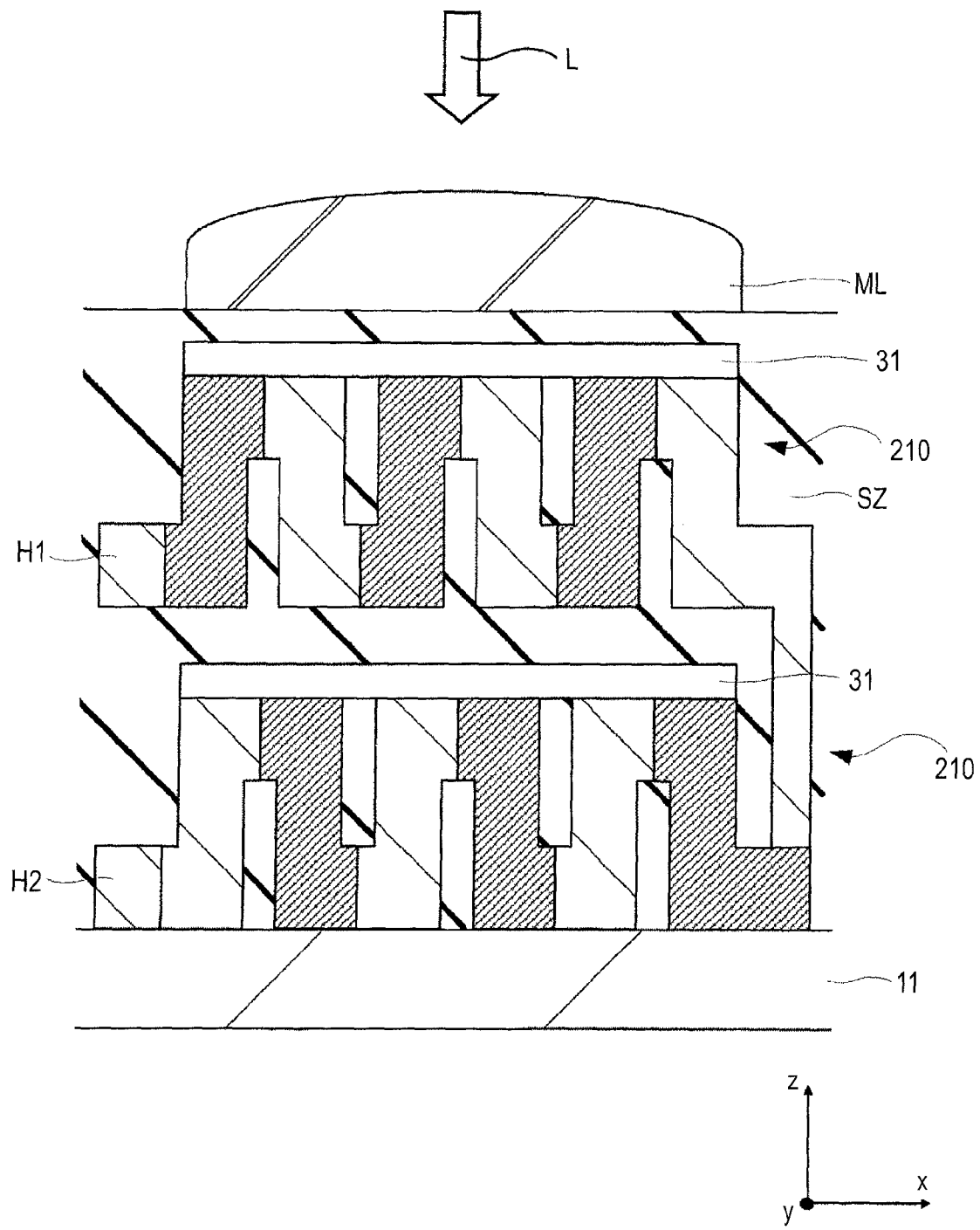
FIG. 19 is a diagram illustrating a main portion of an imaging device according to Embodiment 3 of the present disclosure.

FIG. 19 is a diagram illustrating a main portion of an imaging device according to Embodiment 3 of the present disclosure.

FIG. 19 schematically illustrates the cross-section of the pixel P. FIG. 19 represents the same cross-section as that illustrated in FIG. 1.

As illustrated in FIG. 19, in this embodiment, one pixel P is configured so as to include a plurality of thermocouple device group 210. In addition, the positions at which wiring H1 and H2 are disposed are different from that of Embodiment 1. Except for these points and points relating to these, this embodiment is the same as Embodiment 1. Thus, duplicate description will be appropriately omitted.

As illustrated in FIG. 19, two thermocouple device groups 210 are disposed on the upper face of the substrate 11 onto which incident light L is incident. The two thermocouple device groups 210 are disposed so as to be stacked in the depth direction z of the substrate 11. Although detailed illustration is omitted in the figure, each thermocouple device group 210 is configured similarly to that illustrated in FIGS. 1 and 2. The two thermocouple device groups 210 are connected in series.

As illustrated in FIG. 19, the wirings H1 and H2 are disposed so as to be connected to one end and the other and of the two thermocouple device groups 210 connected in series.

Here, one wiring H1 is disposed on the side face of the upper-stage thermocouple device group 210. In contrast to this, the other wiring H2 is disposed on the side face of the lower-stage thermocouple device group 210.

In addition, each thermocouple device group 210 is disposed such that plasmon resonance occurs in accordance with incidence light L incident to the grating structure, and the temperature of a portion at which the plasmon resonance occurs changes so as to generate an electromotive force.

Here, the incidence light L is incident to the upper-stage thermocouple device group 210 so as to generate electromotive forces, and the incidence light L is incident to the lower-stage thermocouple device group 210 through the upper-stage thermocouple device group 210 so as to generate electromotive forces. In other words, an electromotive is generated in each thermocouple that configures the upper-stage thermocouple device group 210 or the lower-stage thermocouple device group 210, and a current flows along the arrangement direction of the thermocouples connected to in series.

As above, in this embodiment, light output by the upper-stage thermocouple device group 210 is received by the lower-stage thermocouple device group 210 so as to generate an electromotive force, whereby a signal can be acquired. Accordingly, the detection sensitivity can be further improved.

B. Statistics

As above, according to this embodiment, the thermocouple device group 210 is configured such that, similarly to Embodiment 1, the incidence light L is incident to the light receiving face of the grating structure, the plasmon resonance occurs so as to change the temperature of that portion, and an electromotive force is generated. Accordingly, in this embodiment, similarly to Embodiment 1, various advantages such as prevention of the degradation of the image quality due to generation of a white point (white scratch) in the captured image can be acquired.

In addition, in this embodiment, as described above, a plurality of thermocouple device groups 210 are stacked in one pixel P, and accordingly, the detection sensitivity can be further improved.

Thereafter, the image quality of a captured image can be further improved.

Furthermore, the number of stacked thermocouple device groups 210 is not limited to that described above and may be three or more.

4. Embodiment 4

A. Apparatus Configuration and the Like

FIGS. 20 to 22B are diagrams illustrating a main portion of an imaging device according to Embodiment 4 of the present disclosure.

Figure 20:
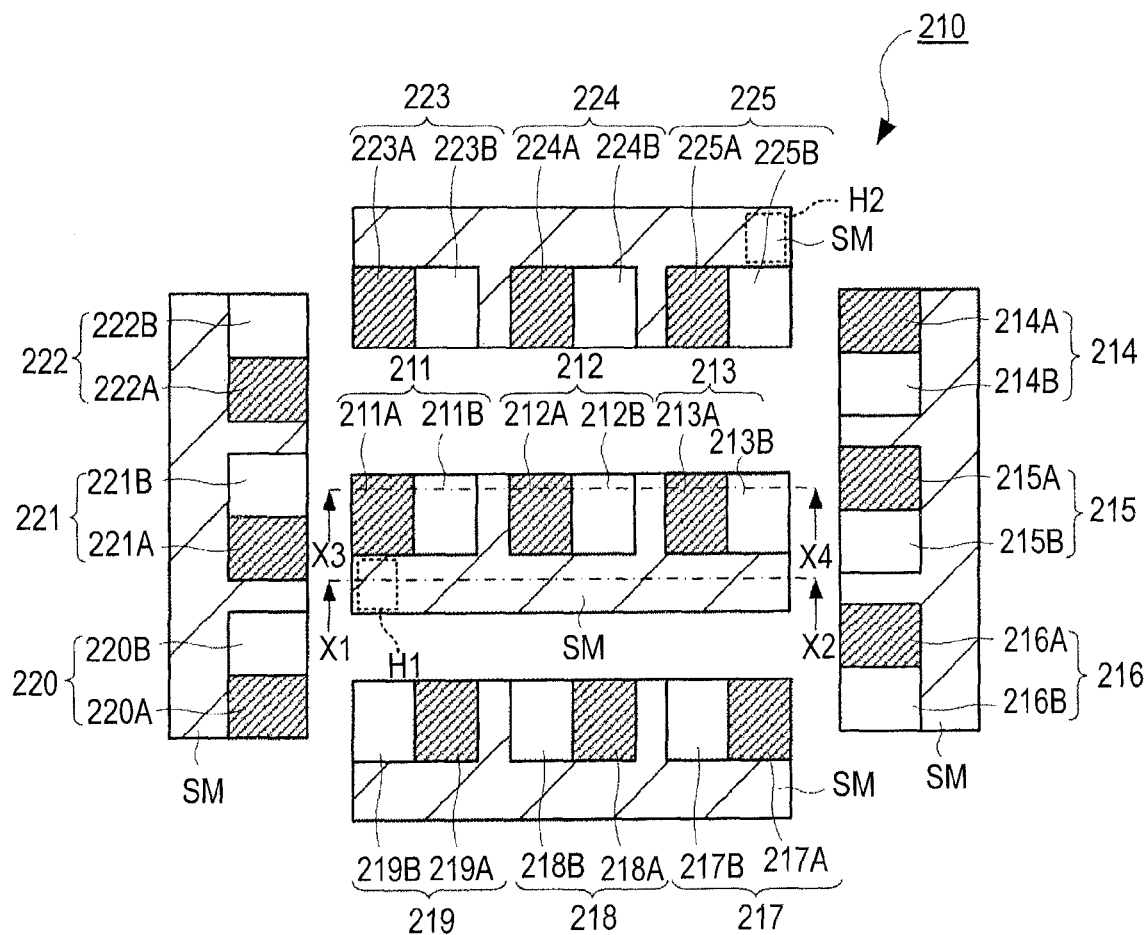
FIG. 20 is a diagram illustrating a main portion of an imaging device according to Embodiment 4 of the present disclosure.
Figure 21:
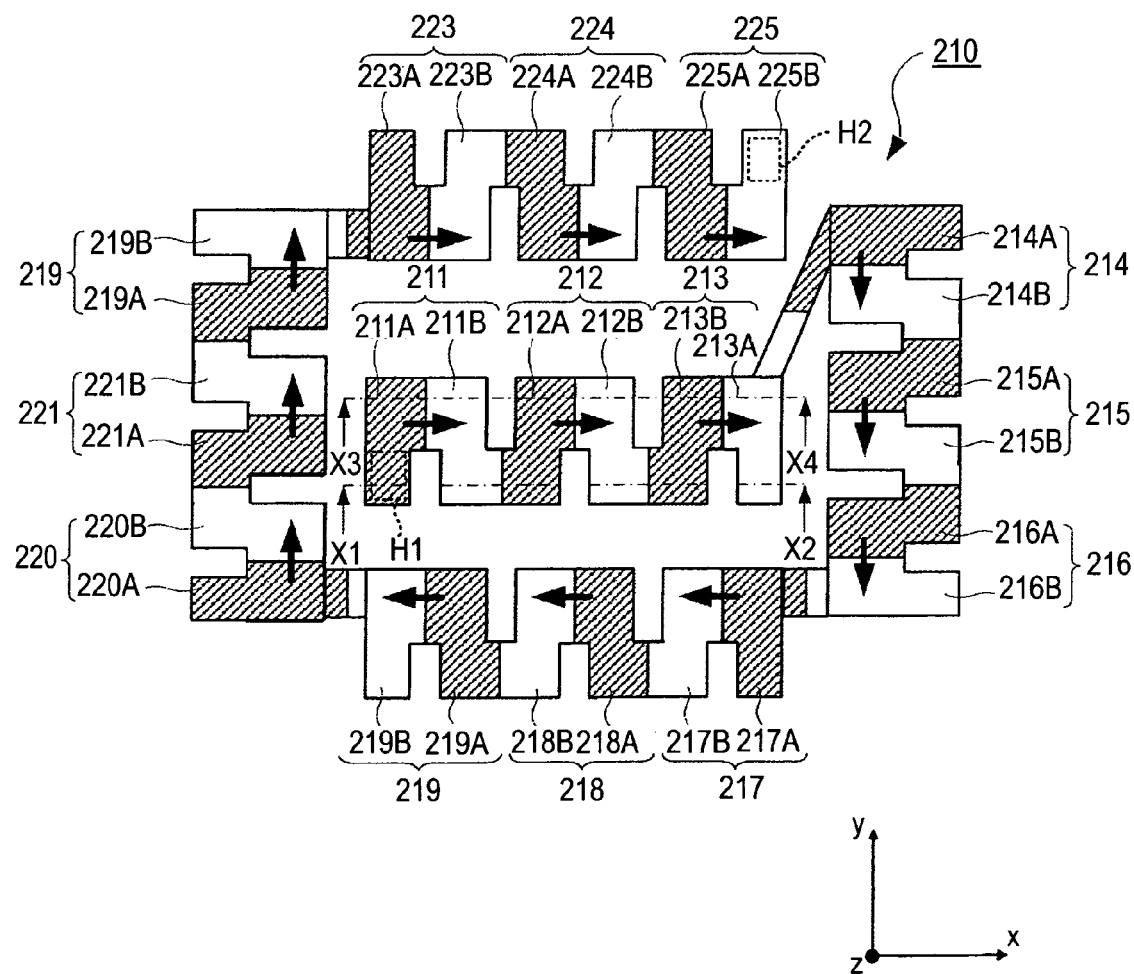
FIG. 21 is a diagram illustrating a main portion of the imaging device according to Embodiment 4 of the present disclosure.

FIGS. 20 and 21 are top views illustrating main portions of a thermocouple device group 210. FIGS. 20 and 21, similarly to FIG. 2, schematically illustrate the upper face. FIG. 20 illustrates a plurality of thermocouples 211 to 224 that configure a thermocouple device group 210. In addition, in FIG. 21, the connection relation between the plurality of thermocouples 211 to 225 is illustrated together with the plurality of thermocouples 211 to 225. In FIG. 21, in order to illustrate the connection relation between the plurality of thermocouples 211 to 225, a light shielding film SM illustrated in FIG. 20 is not shown.

Figure 22A:
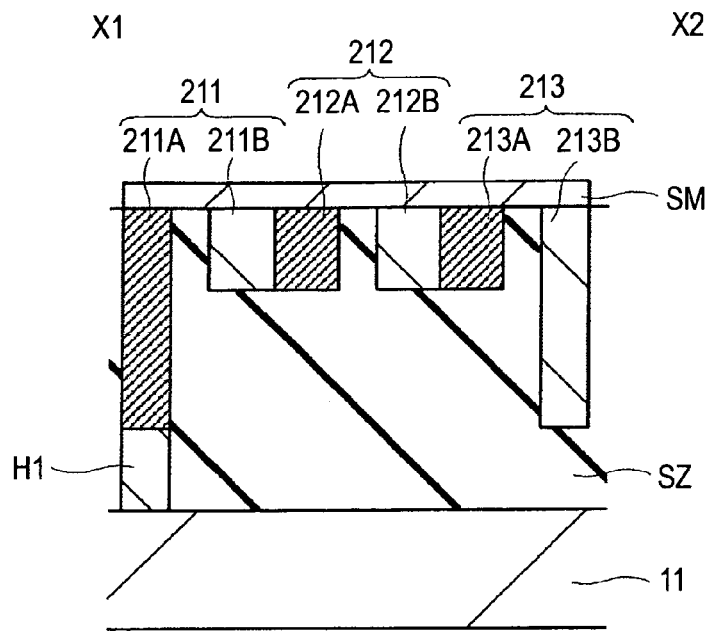
FIGS. 22A and 22B are diagrams illustrating main portions of the imaging device according to Embodiment 4 of the present disclosure.
Figure 22B:
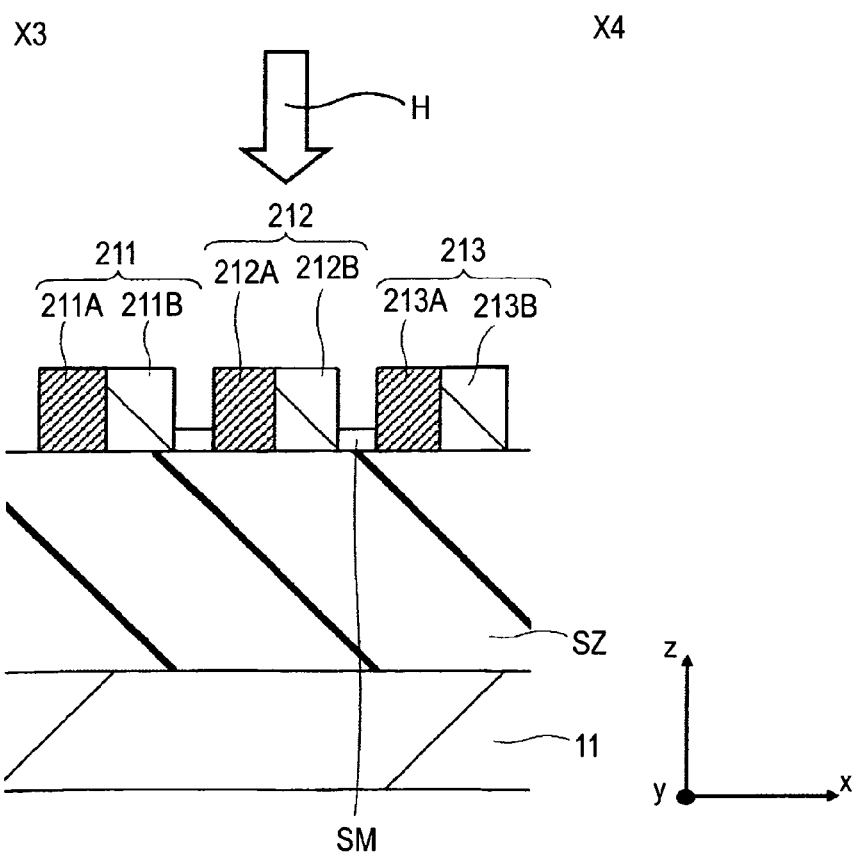

FIGS. 22A and 22B are cross-section views illustrating main portions of the thermocouple device group 210. FIG. 22A illustrates the cross-section taken along line X1-X2 shown in FIGS. 20 and 21. In addition, FIG. 22B illustrates the cross-section taken along line X3-X4 shown in FIGS. 20 and 21.

As illustrated in the figures, in this embodiment, in the thermocouple device group 210, 15 thermocouples including first to fifteenth thermocouples 211 to 225 are disposed. As above, in this embodiment, the number of thermocouples is larger than that of Embodiment 1 described above. In addition, the shapes and the arrangement of the thermocouples 211 to 225 are different from those of Embodiment 1. Furthermore, a light shielding film SM is disposed. Except for this point and other points relating to this point, this embodiment is the same as the above-described Embodiment 1. Thus, duplicate description will be appropriately omitted.

As illustrated in FIGS. 20 to 22B, in the thermocouple device group 210, a plurality of thermocouples 211 to 225 are aligned along the upper face (xy plane) of the substrate 11. In addition, the light shielding film SM is disposed such that a part of the upper face of the plurality of thermocouples 211 to 225 is coated with the light shielding film SM.

As illustrated in FIGS. 20 to 22B, in the thermocouple device group 210, the plurality of thermocouples 211 to 225 are arranged so as to be separated from each other for configuring a grating structure. In addition, in the thermocouple device group 210, the plurality of thermocouples 211 to 225 are disposed such that the grating structure has center-point symmetry.

Here, in each of the plurality of thermocouples 211 to 221, as illustrated in FIG. 20, a portion other than a portion of which the upper face is coated with the light shielding film SM is a rectangle, and the plurality of thermocouples 211 to 221 are arranged in a matrix pattern in the x direction and the y direction. This thermocouple device group 210 is configured such that the rectangular portion includes portions aligned to be equally spaced in the x direction and the y direction.

In this embodiment, as illustrated in FIG. 20, in the center portion of the thermocouple device group 210, three thermocouples are aligned in the x direction, and three thermocouples are aligned in the y direction. More specifically, the first to third thermocouples 211 to 213 are disposed so as to be sequentially aligned from the left side to the right side in the x direction. On the lower side of the first to third thermocouples 211 to 213, the sixth to ninth thermocouples 216 to 219 are disposed so as to be sequentially aligned from the right side to the left side in the x direction. In addition, on the upper side of the first to third thermocouples 211 to 213, the thirteenth to fifteenth thermocouples 223 to 225 are disposed so as to be sequentially aligned from the left side to the right side in the x direction.

In addition, in the thermocouple device group 210, on both side portions with a center portion, in which nine thermocouples are arranged, interposed therebetween in the x direction, three thermocouples are aligned in the y direction. More specifically, on the right side portion, the fourth to sixth thermocouples 214 to 216 are disposed so as to be sequentially aligned from the upper side to the lower side in the y direction. In addition, on the left side portion, the ninth to eleventh thermocouples 219 to 221 are disposed so as to be sequentially aligned from the lower side to the upper side in the y direction.

As above, the thermocouple device group 210 is arranged such that the second thermocouple 212 located on the center is used as the axis, and other thermocouples have point symmetry.

The plurality of thermocouples 211 to 225, as illustrated in FIG. 20, include first metal portions 211A to 225A and second metal portions 211B to 225B.

As illustrated in FIG. 20, in the plurality of thermocouples 211 to 225, the first metal portions 211A to 225A and the second metal portions 211B to 225B are arranged so as to be aligned in the x direction or the y direction so as to be respectively bonded together.

Here, as illustrated in FIG. 21, the plurality of thermocouples 211 to 225 are disposed such that spaces between one end of each of the first metal portions 211A to 225A and the other end of each of the second metal portions 211B to 225B are aligned along the light receiving face (xy plane). In addition, one end of each of the first metal portion 211A to 225A and one end of each of the second metal portions 211B to 225B are bonded together.

In addition, as illustrated in FIG. 21, in the plurality of thermocouples 211 to 225, the other end of each of the first metal portion 211A to 225A and the other end of each of the second metal portion 211B to 225B are sequentially connected in series.

In addition, as illustrated in FIG. 20, the light shielding film SM that shields the incidence light L is disposed so as to cover the other end of each of the first metal portions 211A to 225A and the other end of each of the second metal portions 211B to 225B. Furthermore, the light shielding film SM includes a portion that is formed to be interposed between the thermocouples connected in series.

For example, the light shielding film SM is formed so as to have a film thickness of 50 nm by using W (tungsten) as the material.

As illustrated in FIGS. 20 and 21, wirings H1 and H2 are disposed. Here, the wirings H1 and H2 are respectively connected to one end and the other end of each of the plurality of thermocouples 211 to 225 of the thermocouple device group 210 that are connected in series. In addition, the wirings H1 and H2 are connected to logic circuits (not shown in the figures).

In addition, in the thermocouple device group 210, similarly to Embodiment 1, plasmon resonance occurs in accordance with incidence light L incident to the grating structure, and the temperature of a portion at which the plasmon resonance occurs changes so as to generate electromotive forces in the plurality of thermocouples 211 to 225.

In the thermocouple device group 210, a portion disposed as a heat area HT (temperature measuring junction) is not coated with the light shielding film SM, and a portion disposed as a reference area REF (reference junction) is coated with the light shielding film SM (see FIGS. 20 and 21). Accordingly, in the thermocouple device group 210, when the incidence light L is incident to the temperature measuring junction, a temperature difference between the temperature measuring junction and the reference junction is generated due to the plasmon resonance. Therefore, electromotive forces are generated based on the Seebeck effect.

More specifically, as denoted by thick arrows shown in FIG. 21, in the first to fifteenth thermocouples 211 to 225, electromotive forces are generated, and currents flow. In other words, a current flows along the direction of the arrangement of the first to fifteenth thermocouples 211 to 225.

B. Statistics

As above, according to this embodiment, the thermocouple device group 210 is configured such that, similarly to Embodiment 1, the incidence light L is incident to the light receiving face of the grating structure, the plasmon resonance occurs so as to change the temperature of that portion, and an electromotive force is generated. Accordingly, in this embodiment, similarly to Embodiment 1, various advantages such as prevention of the degradation of the image quality due to generation of a white point (white scratch) in the captured image can be acquired.

In addition, according to this embodiment, the number of thermocouples is larger than that of Embodiment 1. Accordingly, the detection sensitivity can be further improved.

Therefore, the image quality of the captured image can be further improved.

5. Embodiment 5

A. Apparatus Configuration and the Like

FIG. 23 is a diagram illustrating a main portion of an imaging device according to Embodiment 5 of the present disclosure.

FIG. 23 schematically illustrates the cross-section of the pixel P. FIG. 23 represents the same cross-section as that illustrated in FIG. 1.

As illustrated in FIG. 23, in this embodiment, the thermocouple device group 210 is formed so as to include a nanospring NS. Except for this point, this embodiment is the same as Embodiment 1. Thus, duplicate description will be appropriately omitted.

As illustrated in FIG. 23, in the first to third thermocouples 211 to 213, one end (upper end) and the other end (lower end) of each of the first metal portion 211A to 213A and the second metal portion 211B to 213B are formed so as to have a nanospring NS interposed therebetween. Although not shown in the figure, the relation between the fourth to sixth thermocouples 214 to 216 is similarly formed.

The nanospring NS is formed by creating a seed and forming a film through ion milling while rotating the seed.

B. Statistics

As above, according to this embodiment, the thermocouple device group 210 is configured such that, similarly to Embodiment 1, the incidence light L is incident to the light receiving face of the grating structure, the plasmon resonance occurs so as to change the temperature of that portion, and an electromotive force is generated. Accordingly, in this embodiment, similarly to Embodiment 1, various advantages such as prevention of the degradation of the image quality due to generation of a white point (white scratch) in the captured image can be acquired.

In addition, according to this embodiment, as described above, one end (upper end) and the other end (lower end) of each of the first metal portions 211A to 213A and the second metal portions 211B to 213B are formed so as to have the nanospring NS interposed therebetween. Accordingly, between the temperature measuring junction and the reference junction, a propagation path for heat extends to be long. Therefore, the propagation of heat is alleviates, whereby the detection sensitivity can be improved.

Therefore, the image quality of a captured image can be further improved.

6. Embodiment 6

A. Correction Process

Figure 24:
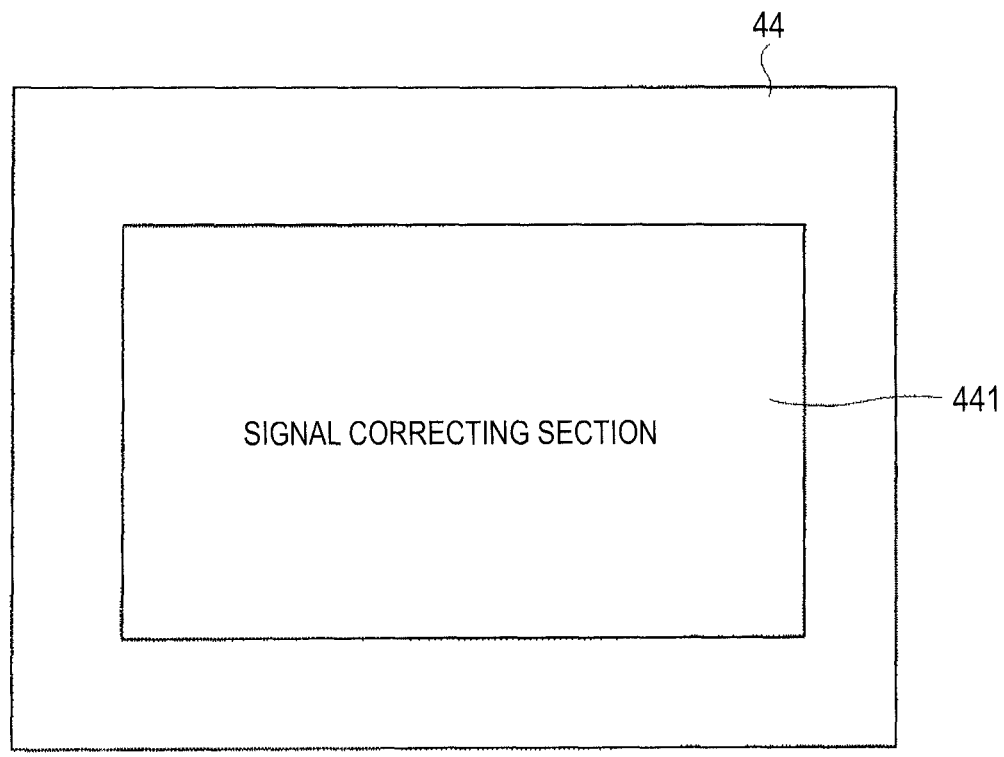
FIG. 24 is a block diagram illustrating a main portion of a signal processing unit (see FIG. 5) according to Embodiment 6 of the present disclosure.

FIG. 24 is a block diagram illustrating a main portion of a signal processing unit 44 (see FIG. 5) according to Embodiment 6 of the present disclosure.

As illustrated in FIG. 24, in this embodiment, the signal processing unit 44 includes a signal correcting section 441.

Except for this point, this embodiment is the same as Embodiment 1. Thus, duplicate description will be appropriately omitted.

The signal correcting section 441 performs a correction process for a signal (detection data) based on the electromotive force generated in each pixel P through an imaging operation. Here, as a computer executes a program, which is used for a correction process, for the signal (detection data) based on the electromotive force generated in the pixel P through an imaging operation, it serves as the signal correcting section 441.

In the thermocouple device group 210, an electromotive force is generated in accordance with a temperature difference between the heat area HT located on the upper portion and the reference area REF located on the lower portion, and a signal according to the electromotive force is used for generating a captured image (see FIG. 1). Accordingly, when exposure is made continuously or for a long time, the state of the reference temperature changes in accordance with the heat, whereby the detection sensitivity decreases. Therefore, there is case where the image quality of the captured image is degraded. Accordingly, in order to prevent degradation of the image quality due to such a problem, the signal correcting section 441 performs a correction process for the signal (detection data) that is based on the electromotive force generated in the pixel P through the imaging operation. Then, the signal processing unit 44 generates a captured image based on the corrected signal.

Figure 25:
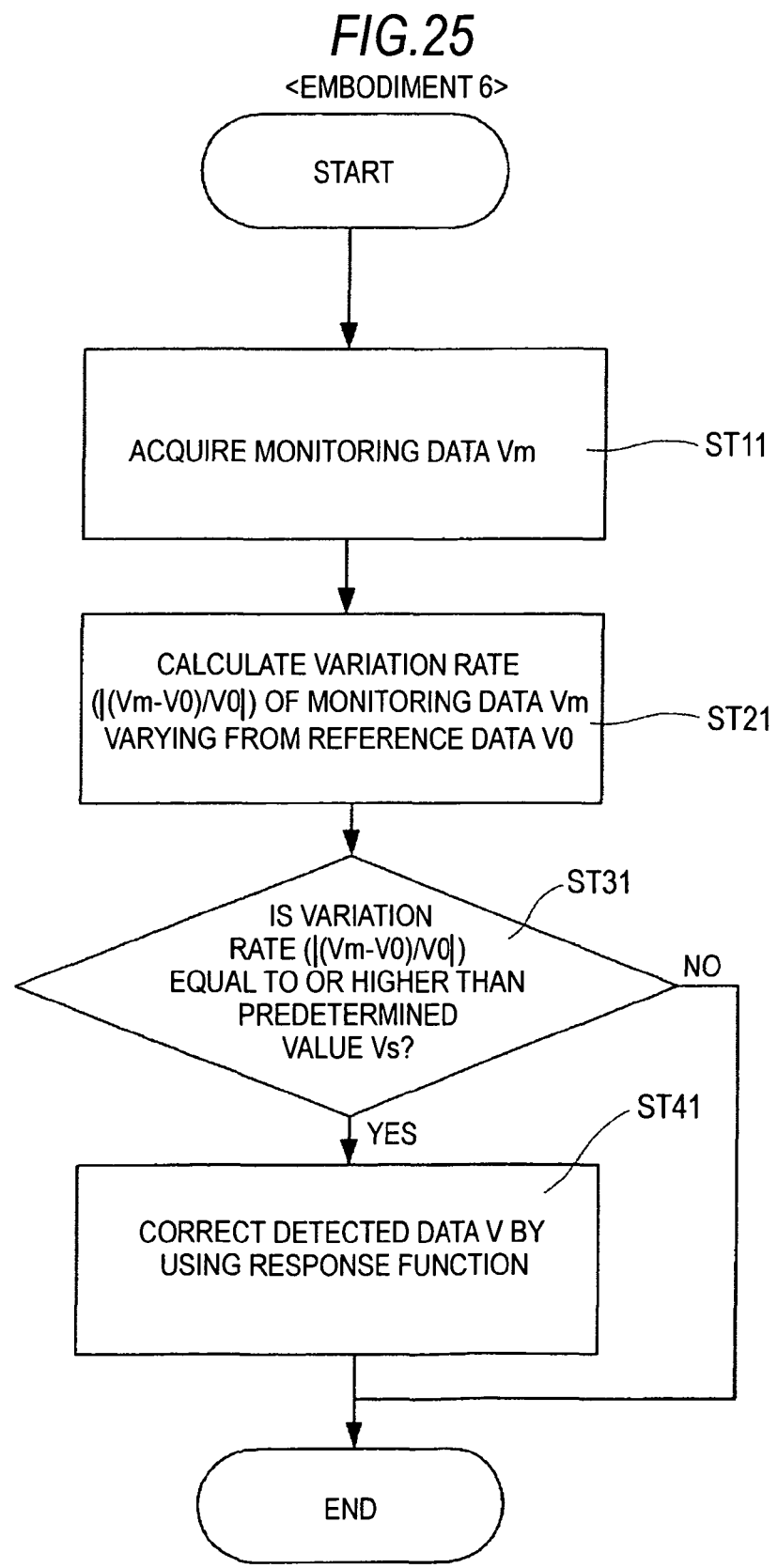
FIG. 25 is a flowchart illustrating the operation of a correction process according to Embodiment 6 of the present disclosure.

FIG. 25 is a flowchart illustrating the operation of a correction process according to Embodiment 6 of the present disclosure.

(1) Acquisition of Monitoring Data

First, as illustrated in FIG. 25, monitoring data Vm is acquired (ST11).

Here, the control unit 43 (see FIG. 1) allows each pixel P of the imaging device 1 to output monitoring data Vm to the signal processing unit 44 by outputting a control signal to the imaging device 1.

For example, the control unit 43 performs this monitoring operation at timing different from that of the imaging operation. Then, in the monitoring operation, a signal that is acquired based on the electromotive force generated in the thermocouple device group 210 that is included in each pixel P is output to the signal processing unit 44 as the monitoring data Vm. For example, this monitoring data Vm is output by performing a monitoring operation immediately before the imaging operation.

(2) Calculation of Variation Rate

Next, as illustrated in FIG. 25, the variation rate $(|(Vm-V0)/V0|)$ that is a variation rate of the monitoring data Vm from the reference data V0 is calculated (Step ST21).

Here, a differential process in which a difference between the monitoring data Vm and the reference data V0 set in advance is calculated is performed by the signal correcting section 441. Thereafter, a division process of dividing the absolute value of the difference value (Vm−V0) by the reference data V0 is performed by the signal correcting section 441. Accordingly, the variation rate $(|(Vm-V0)/V0|)$ that is a variation rate of the monitoring data Vm from the reference data V0 is calculated for each pixel P.

(3) Comparison Between Variation Rate and Threshold Value

Next, as illustrated in FIG. 25, it is determined whether the variation rate $(|(Vm-V0)/V0|)$ is equal to or higher than a predetermined value Vs (Yes) or not (No) (Step ST31).

Here, a comparison process of comparing the variation rate $(|(Vm-V0)/V0|)$ calculated as described above with the predetermined value Vs set as a threshold value in advance is performed by the signal correcting section 441.

In this comparison process, in a case where the variation rate $(|(Vm-V0)/V0|)$ is determined not to be equal to or higher than the predetermined value Vs (No), this operation ends without performing a correction process of the next step (Step ST41). For example, in a case where the predetermined value Vs is not equal to or more than 0.1, the correction process is not performed.

In contrast to this, in a case where the variation rate $(|(Vm-V0)/V0|)$ is determined to be equal to or higher than the predetermined value Vs (Yes), the process proceeds to the next Step (Step ST41). For example, in a case where the predetermined value Vs is equal to or larger than 0.1, the correction process is performed in the next step (Step ST41).

(4) Correction of Detection Data

As illustrated in FIG. 25, in a case where the variation rate $(|(Vm-V0)/V0|)$ is determined to be equal to or higher than the predetermined value Vs (Yes), the detection data V is corrected by using a response function (Step ST41).

Here, a correction coefficient H is calculated based on the variation rate $(|(Vm-V0)/V0|)$ and the response function of the electromotive force for the light intensity of the incidence light.

Figure 26:
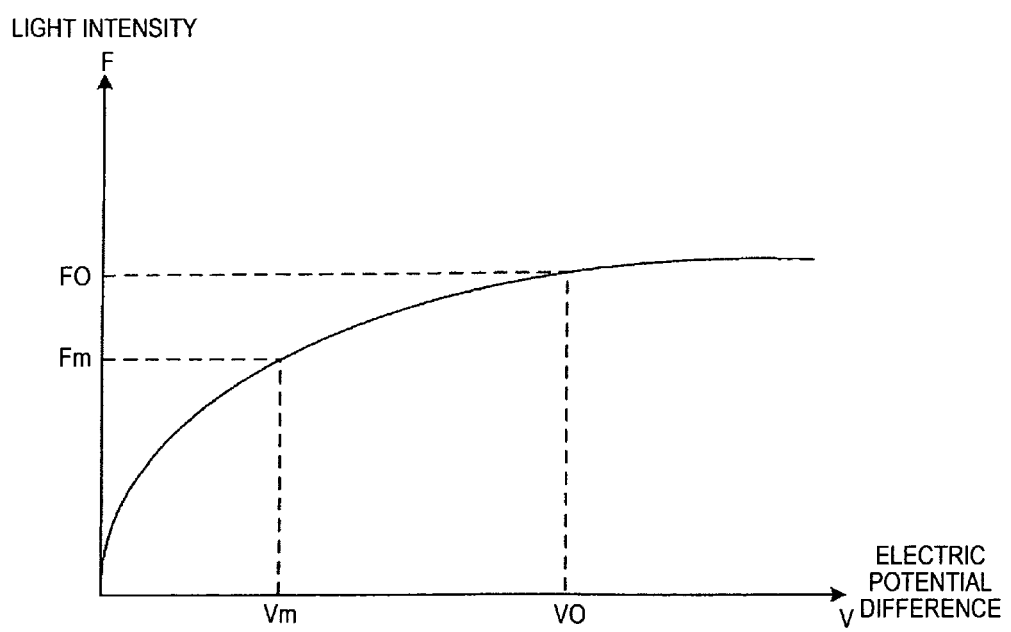
FIG. 26 is a diagram illustrating a response function of an electromotive force with respect to the light intensity of incidence light according to Embodiment 6.

FIG. 26 is a diagram illustrating a response function of an electromotive force with respect to the light intensity of incidence light according to Embodiment 6 of the present disclosure.

In FIG. 26, the horizontal axis represents the electromotive force (electric potential difference) V generated in the thermocouple device group 210, and the vertical axis represents the light intensity F of the incidence light.

As illustrated in FIG. 26, when the thermocouple device group 210 operates at appropriate temperature, the reference light intensity F0 can be acquired based on the reference data V0. However, when the temperature of the thermocouple device group 210 changes from the appropriate temperature, and the monitoring data Vm is lowered from the reference data V0, the appropriate light intensity is not the light intensity F0, and it is detected that the light intensity Fm that is lower than light intensity F0 has been received.

Accordingly, after the light intensity F0 corresponding to the reference data V0 and the light intensity Fm corresponding to the monitoring data Vm are calculated based on the response function acquired in advance, a value (F0/Fm) acquired by dividing the light intensity F0 by the light intensity Fm is calculated as a correction coefficient H for each pixel P.

Then, in the imaging operation, by integrating the correction coefficient H with the signal (detection data) V that is based on the electromotive force generated in each pixel P, the signal (detection data) V based on the electromotive force generated in each pixel P is corrected. Accordingly, even in a case where an imaging operation is performed in a state in which the temperature of the thermocouple device group 210 changes from the reference temperate state, the detection data is corrected so as to be close to detection data that is to be detected in the reference temperature state.

For example, at the interval of one second, a monitoring operation is performed, and, for each signal (detection data) acquired through an imaging operation performed after the monitoring operation, correction is made as described above.

In addition, in the above-description, a case has been described that a predetermined value is used as the reference data V0, however, the present disclosure is not limited thereto. For example, out of monitoring data Vm acquired a plurality of times in a case where an imaging is performed, the monitoring data Vm acquired first may be used as the reference data V0. In addition, it may be configured such that, for the calculation of the correction coefficient H, a lookup table in which the monitoring data Vm and the correction coefficient H are associated with each other is stored in a memory, and a correction coefficient H corresponding to the acquired monitoring data Vm is extracted from the lookup table.

B. Statistics

As described above, in this embodiment, even in a case where an imaging operation is performed in the state in which the temperature of the thermocouple device group 210 changes from the reference temperature, the detection data acquired through the imaging operation is corrected in accordance with the changed temperature.

Therefore, according to this embodiment, the image quality of the captured image can be improved.

7. Embodiment 7

A. Cooling Process

Figure 27:
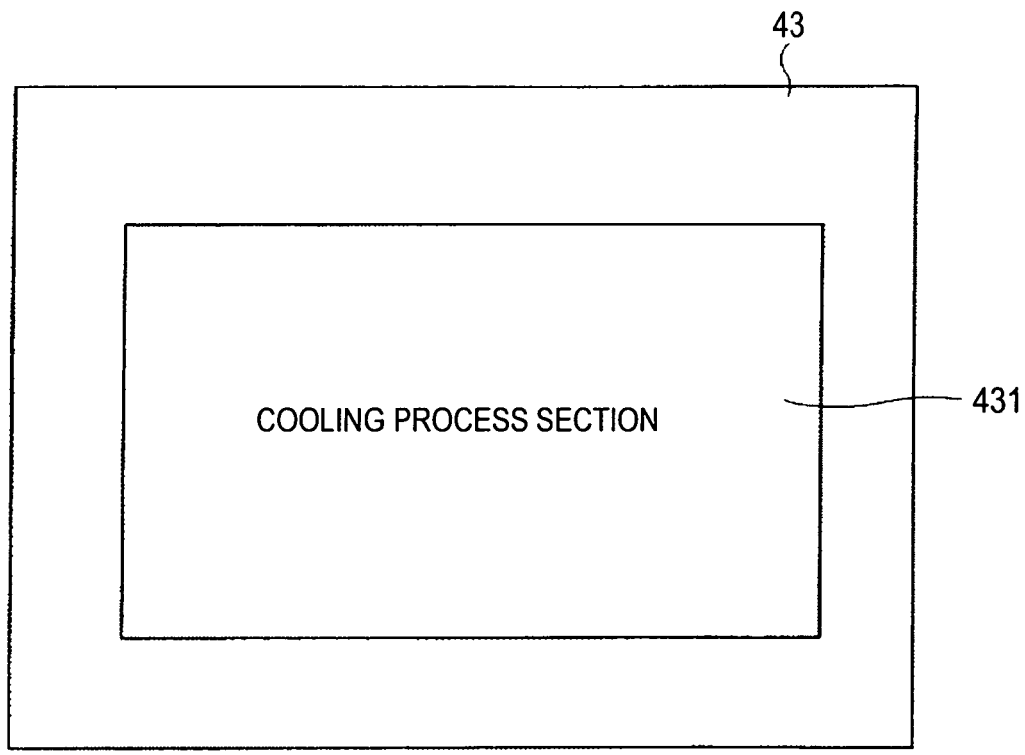
FIG. 27 is a block diagram illustrating a main portion of a control unit (see FIG. 5) according to Embodiment 7 of the present disclosure.

FIG. 27 is a block diagram illustrating a main portion of a control unit 43 (see FIG. 5) according to Embodiment 7 of the present disclosure.

As illustrated in FIG. 27, in this embodiment, the control unit 43 includes a cooling processing section 431. Except for this point, this embodiment is the same as Embodiment 1. Thus, duplicate description will be appropriately omitted.

The cooling processing section 431 controls the operation of cooling the thermocouples 211 to 216 (see FIGS. 1 and 2) configuring the thermocouple device group 210. Although described later in detail, the cooling processing section 431 allows current in the direction opposite to currents, which flow in the thermocouples 211 to 216 based on the Seebeck effect, to flow. Here, the cooling processing section 431 allows currents in the opposite direction to flow in the thermocouples 211 to 216 so as to decrease the amount of heat corresponding to a difference value between the monitoring data Vm and the reference data V0. Accordingly, the cooling processing section 431 performs a cooling process for the thermocouples 211 to 216 based on the Peltier effect. Here, a computer executes a program used for performing the above-described cooling process, thereby serving as the cooling processing section 431.

As described above, when the imaging operation is performed continuously or for a long time, the detection sensitivity of thermocouple device group 210 decreases due to a change from the reference temperature state that is caused by heat, and there is a case where the image quality of the captured image is degraded. Accordingly, before a signal (detection data) is acquired from the pixel P through an imaging operation, the signal correcting section 441 performs a cooling process such that the thermocouple device group 210 is in the reference temperature state. Then, in the state in which the thermocouple device group 210 is cooled so as to have temperature close to the reference temperature, an imaging operation is performed so as to acquire a signal (detection data), and the signal processing unit 44 generates a captured image based on the signal.

FIG. 28 is a flowchart illustrating the operation of a cooling process according to Embodiment 7 of the present disclosure.

(1) Acquisition of Monitoring Data

First, as illustrated in FIG. 28, monitoring data Vm is acquired (Step ST11).

Here, similarly to Embodiment 6, the control unit 43 (see FIG. 1) outputs a control signal to the imaging device 1, and monitoring data Vm is output to the signal processing unit 44 from each pixel of the imaging device 1.

For example, the control unit 43 outputs signals acquired based on the electromotive forces of the thermocouple device group 210 included in each pixel P of the imaging device 1 to the signal processing unit 44 as the monitoring data Vm at timing different from that of the imaging operation. For example, immediately before the imaging operation, a monitoring operation is performed and outputs the monitoring data Vm.

(2) Calculation of Variation Rate

Next, as illustrated in FIG. 28, the variation rate ($|(Vm-V0)/V0|$) that is a variation rate of the monitoring data Vm from the reference data V0 is calculated (Step ST21).

Here, similarly to Embodiment 6, a differential process in which a difference between the monitoring data Vm and the reference data V0 set in advance is calculated is performed by the signal correcting section 441. Thereafter, a division process of dividing the absolute value of the difference value (Vm−V0) by the reference data V0 is performed by the signal correcting section 441. Accordingly, the variation rate ($|(Vm-V0)/V0|$) that is a variation rate of the monitoring data Vm from the reference data V0 is calculated for each pixel P.

(3) Comparison Between Variation Rate and Threshold Value

Next, as illustrated in FIG. 28, it is determined whether the variation rate ($|(Vm-V0)/V0|$) is equal to or higher than a predetermined value Vs (Yes) or not (No) (Step ST31).

Here, similarly to Embodiment 6, a comparison process of comparing the variation rate ($|(Vm-V0)/V0|$) calculated as described above with the predetermined value Vs set as a threshold value in advance is performed by the signal processing section 441.

In this comparison process, in a case where the variation rate ($|(Vm-V0)/V0|$) is determined not to be equal to or higher than the predetermined value Vs (No), this operation ends without performing a correction process of the next step (Step ST41b).

In contrast to this, in a case where the variation rate ($|(Vm-V0)/V0|$) is determined to be equal to or higher than the predetermined value Vs (Yes), the process proceeds to the next Step (Step ST41b).

(4) Cooling Process of Thermocouple Device Group 210

As illustrated in FIG. 28, in a case where the variation rate ($|(Vm-V0)/V0|$) is determined to be equal to or higher than the predetermined value Vs (Yes), the cooling process is performed for the thermocouple device group 210 (Step ST41b).

FIG. 29 is a cross-sectional view illustrating the operation of the cooling process according to Embodiment 7 of the present disclosure. FIG. 29 schematically illustrates the cross-section of the pixel P. FIG. 29 represents the same cross-section as that illustrated in FIG. 7.

As illustrated in FIG. 29, when the cooling process is performed for the thermocouple device group 210, currents (white arrows) in the direction opposite to currents (black arrows) flowing based on the Seebeck effect in the thermocouples 211 to 216 (in FIG. 29, the thermocouples 214 to 216 are not shown) are allowed to flow.

Here, in order to decrease the amount of heat corresponding to a difference (Vm−V0) between the monitoring data Vm and the reference data V0, the currents in the opposite directions are allowed to flow through the thermocouples 211 to 216.

For example, a lookup table is stored in the memory in which a difference value (Vm−V0) between the monitoring data Vm and the reference data V0 and the values of the current flowing in the opposite direction in the thermocouples 211 to 216 are associated. Then, the current value corresponding to the difference value (Vm−V0) between the monitoring data Vm and the reference data V0 is extracted from the lookup table for each pixel P. Then, a current having the extracted current value is allowed to flow in each one of the thermocouples 211 to 216.

Accordingly, the thermocouples 211 to 216 are cooled based on the Peltier effect.

Then, after the completion of the cooling process, the imaging operation is performed, and a signal (detection data) that is based on the electromotive force generated for each pixel P is acquired. Here, since the imaging operation is performed in the state in which the thermocouple device group 210 is close to the reference temperature state, the detection data is close to detection data detected in the reference temperature state.

For example, at an interval of one second, a monitoring operation is performed, and the imaging operation is performed in the state in which the cooling process is performed in a state close to the reference temperature state.

B. Statistics

As described above, in this embodiment, even in a case where the thermocouple device group 210 changes from the reference temperature state, after the temperature of the thermocouple device group 210 is close to the reference temperature by cooling processing, the imaging operation is performed.

Therefore, according to this embodiment, the image quality of a captured image can be improved.

8. Embodiment 8

A. Imaging Operation

Figure 30A:
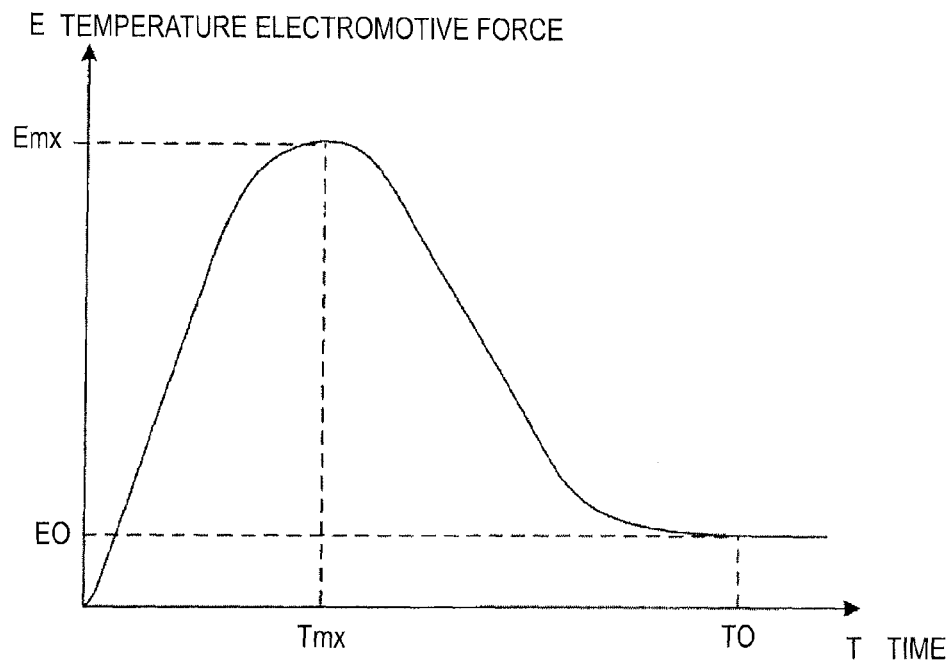
FIGS. 30A and 30B are diagrams illustrating an imaging operation according to Embodiment 8 of the present disclosure.
Figure 30B:
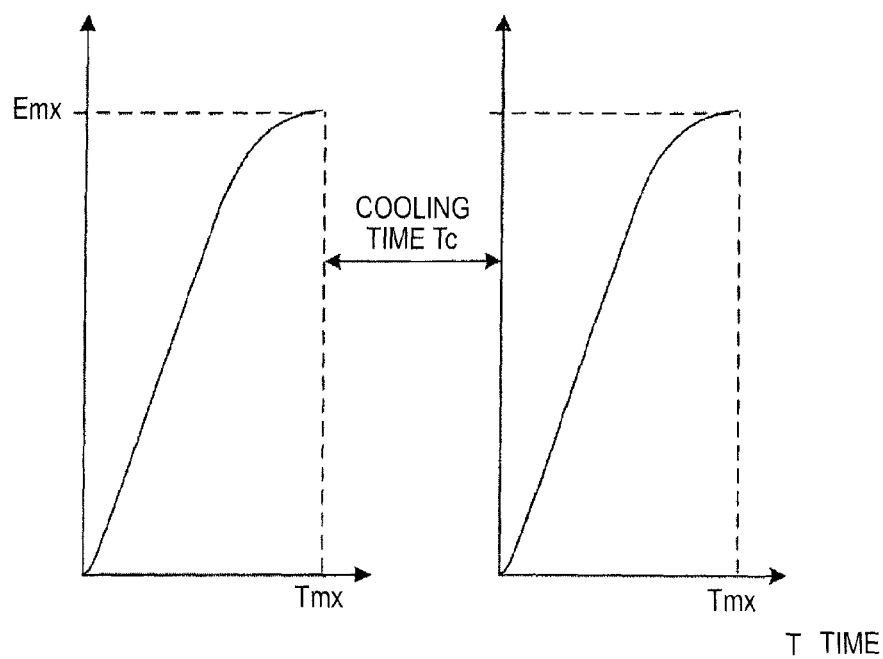

FIGS. 30A and 30B are diagram illustrating an imaging operation according to Embodiment 8 of the present disclosure.

As illustrated in FIGS. 30A and 30B, in this embodiment, the control unit 43 can perform an imaging process through various imaging operations. Except for this point, this embodiment is the same as Embodiment 1. Thus, duplicate description will be appropriately omitted.

As illustrated in FIG. 30A, when a light reception time T elapses, in the thermocouple device group 210, the electromotive force E increases, and after the maximum electromotive force Emx is generated at a predetermined time point Tmx, the electromotive force E decreases. Accordingly, in this embodiment, the control unit 43 controls each unit such that an electric potential is detected so as to acquire a signal at the time point Tmx in one frame time at which the electromotive force E of the thermocouple device group 210 is the maximum value Emx. Then, a captured image is generated based on the signal acquired as described above.

In addition, as illustrated in FIG. 30B, the control unit 43 may control each unit such that a plurality of electric potential detecting operations of generating a signal by detecting an electric potential at the time point Tmx, at which the electromotive force E generated in the thermocouple device group 210 has the maximum value Emx in one frame time, are repeatedly performed.

In such a case, the control unit 43 controls each unit such that a cooling operation of cooling the thermocouple device group 210 between the plurality of electric potential detecting operations. More specifically, a cooling time Tc is arranged between the plurality of electric potential detecting operations, and the cooling operation is performed such that the electromotive force E of the thermocouple device group 210 has an initial value. For example, as illustrated in Embodiment 7, the Peltier effect is allowed to occur in the thermocouple device group 210, thereby performing the cooling operation.

Thereafter, a captured image is generated based on the signal acquired by integrating a plurality of the signals. In other words, it may be configured such that the integrated voltage is detected as an effective voltage for one frame so as to generate a capture image.

B. Statistics

As above, in this embodiment, by detecting the electric potential at the time point Tmx at which the electromotive force E generated in the thermocouple device group 210 has the maximum value Emx in one frame time, a signal is acquired, and a captured image is generated based on the acquired signal.

In addition, in this embodiment, a plurality of the electric potential detecting operations of detecting the electric potential so as to generate a signal at a time point Tmx, at which the electromotive force E generated in the thermocouple device group 210 has the maximum value, may be repeatedly performed in one frame time. Thereafter, a plurality of signals are integrated. Then, a captured image is generated based on the signal acquired through the integration. Here, during the plurality of electric potential detecting operations, a cooling operation of cooling the thermocouple device group 210 is performed.

As above, in this embodiment, a signal is acquired in the state in which a temperature difference between the heat area HT and the reference area REF is the maximum, and a captured image is generated based on the acquired signal.

Therefore, according to this embodiment, the image quality of a captured image can be improved.

In addition, it may be configured such that the electromotive force generated in the thermocouple device group 210 is applied as feedback as a driving power for a driving operation. In other words, the control unit 43 may control each unit such that a part of the detected electric potential is used as the driving power of the imaging device 1. In such a case, a decrease in the power consumption can be realized.

9. Embodiment 9

A. Apparatus Configuration

FIG. 31 is a top view illustrating a main portion of a photovoltaic cell according to Embodiment 9 of the present disclosure.

As illustrated in FIG. 31, in the photovoltaic cell, a plurality of cells CE having a hexagonal external shape are arranged so as to have a honeycomb structure.

Although not shown in the figure, in the photovoltaic cell, each cell CE includes a photovoltaic device that receives incidence light on the light receiving face and generates an electromotive force. Here, the photovoltaic device includes the thermocouple device group 210 shown in FIG. 15 and is configured so as to receive light by using the thermocouple device group 210 and generate an electromotive force.

In other words, as illustrated in FIG. 15, in the thermocouple device group 210, a plurality of thermocouples 211 to 219 are disposed so as to be separated from each other such that the light receiving face forms a grating structure. Then, the incidence light is incident to the grating structure, plasmon resonance occurs on the light receiving face, and a portion of the thermocouple device group in which the plasmon resonance occurs changes. Accordingly, electromotive forces are generated in the plurality of thermocouples 211 to 219.

The photovoltaic cell, as illustrated in FIG. 31, includes a visible light cell VR that selectively receives visible light, a ultraviolet cell UV that selectively receives ultraviolet light, and an infrared light cell IR that selectively receives infrared light.

Accordingly, in each cell CE, the thermocouple device group 210 is formed so as to have a different grating structure in correspondence with the wavelength of light to be received.

For example, the visible light cell VR is formed such that the shape of the concave and convex portions of the thermocouple device group 210, for example, has a periodical structure in which the height of the convex portion is 40 nm, and the pitch is 120 nm.

For example, the ultraviolet light cell UV is formed such that the shape of the concave and convex portions of the thermocouple device group 210, for example, has a periodical structure in which the height of the convex portion is 10 nm, and the pitch is 40 nm.

For example, the infrared light cell IR is formed such that the shape of the concave and convex portions of the thermocouple device group 210, for example, has a periodical structure in which the height of the convex portion is 80 nm, and the pitch is 350 nm.

B. Statistics

As above, in this embodiment, the photovoltaic cell is configured by the thermocouple device group 210 that is the same as that according to Embodiment 1 (Modified Example 2). Since the output of the thermocouple device group 210 is a voltage, it can be applied to a photovoltaic cell.

Thus, according to this embodiment, the cost can be lowered in an easy manner. In addition, compared to a photovoltaic cell using an inorganic material such as a dye-sensitized type, there is scarcely deterioration due to ultraviolet light, and stable power supply can be performed with a long life.

In addition, in this embodiment, similarly to the above-described imaging apparatus, various modified forms can be applied. In other words, a plurality of the thermocouple device groups 210 may be staked on the light receiving face. In addition, an optical member such as a micro lens may be appropriately disposed in each cell.

10. Others

The present disclosure is not limited to the above-described embodiments, and various modified examples can be employed.

For example, by appropriately setting the aspect ratio of the concave and convex portions of the grating structure, imaging can be performed for bands from an ultraviolet band to terra hertz and a broadband up to an electric wave band of 1 to 10 millimeter.

In addition, the concave and convex portions of the grating structure may be periodical or non-periodical.

Furthermore, in the imaging device, although a case has been illustrated in which a micro-lens is disposed in the pixel, the micro-lens may not be disposed depending on its use. In addition, in the above description presented above, although a color filter is not disposed, the color filter may be disposed depending on its use.

In the above-described embodiment, although a case has been described in which the imaging device is applied to a camera, the present disclosure is not limited thereto. An embodiment of the present disclosure may be applied to other electronic apparatuses such as a scanner and a copy machine that include an imaging device.

Furthermore, the above-described embodiments may be appropriately combined.

In the above-described embodiment, the imaging device 1 corresponds to an imaging unit according to an embodiment of the present disclosure. In addition, in the above-described embodiment, the substrate 11 corresponds to a substrate according to an embodiment of the present disclosure. Furthermore, in the above-described embodiment, the air gap layer 31 corresponds to an air gap according to an embodiment of the present disclosure. In addition, in the above-described embodiment, the camera 40 corresponds to an electronic apparatus according to an embodiment of the present disclosure. In the above-described embodiment, the metal film 41 corresponds to a metal film according to an embodiment of the present disclosure. In addition, in the above-described embodiment, the thermocouple device group 210 corresponds to a thermocouple device group according to an embodiment of the present disclosure. Furthermore, in the above-described embodiment, the thermocouples 211 to 225 correspond to thermocouples according to an embodiment of the present disclosure. In addition, in the above-described embodiment, the first metal portions 211A to 225A correspond to first metal portions according to an embodiment of the present disclosure. In addition, in the above-described embodiment, the second metal portions 211B to 225B correspond to second metal portions according to an embodiment of the present disclosure. Furthermore, in the above-described embodiment, the cooling processing section 431 corresponds to a cooling processing unit according to an embodiment of the present disclosure. In addition, in the above-described embodiment, the signal correcting section 441 corresponds to a signal correcting unit according to an embodiment of the present disclosure. Furthermore, in the above-described embodiment, the nanospring NS corresponds to a nanospring according to an embodiment of the present disclosure. In addition, in the above-described embodiment, the pixel P corresponds to a pixel according to an embodiment of the present disclosure. Furthermore, in the above-described embodiment, the light shielding film SM corresponds to a light shielding film according to an embodiment of the present disclosure.

The present disclosure contains subject matter related to that disclosed in Japanese Priority Patent Application JP 2010-279359 filed in the Japan Patent Office on Dec. 15, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. An imaging apparatus comprising:
    an imaging unit in which a plurality of pixels receiving incidence light on a light receiving face are disposed in an imaging region of a substrate,
    wherein the pixel includes a thermocouple device group in which a plurality of thermocouples are aligned along the light receiving face, wherein, in the thermocouple device group, the plurality of thermocouples are arranged so as to be separated from each other such that the light receiving face has a grating structure, and wherein the thermocouple device group is disposed such that the incidence light is incident to the grating structure so as to cause plasmon resonance to occur on the light receiving face, and an electromotive force is generated due to a change in the temperature of a portion of the thermocouple device group, at which the plasmon resonance occurs, in each of the plurality of thermocouples.

2. The imaging apparatus according to claim 1, wherein, in the thermocouple device group, the plurality of thermocouples are connected in series.

3. The imaging apparatus according to claim 2, wherein, in the thermocouple device group, the plurality of thermocouples are disposed such that the grating structure has center-point symmetry on the light receiving face.

4. The imaging apparatus according to claim 3, wherein the thermocouple device group is disposed such that each of the plurality of thermocouples is located in an amplified electric field area that is generated owing to the plasmon resonance occurring on the light receiving face.

5. The imaging apparatus according to claim 4, wherein, in each of the plurality of thermocouples, a first metal portion and a second metal portion that has a thermoelectric power different from that of the first metal portion are aligned along the light receiving face.

6. The imaging apparatus according to claim 5, wherein, in each of the thermocouples, one end of the first metal portion and one end of the second metal portion are bonded in a depth direction of the substrate on a side onto which the incidence light is incident, the other end of the first metal portion and the other end of the second metal portion are located on a side from which the incidence light is output, and the plurality of thermocouples are connected in series.

7. The imaging apparatus according to claim 6, wherein, in the thermocouple device group, an insulating film is disposed on a face onto which the incident light is incident, and an air gap is interposed between the face onto which the incidence light is incident and the insulating layer.

8. The imaging apparatus according to claim 6,
wherein the thermocouple device group includes a metal film with which the face onto which the incidence light is incident is coated, and
wherein the metal film is formed by using metal in which the plasmon resonance can occur more easily than in the first metal portion and the second metal portion.

9. The imaging apparatus according to claim 6, wherein each of the plurality of thermocouples is formed such that a nanospring is interposed between one ends and the other ends of the first metal portion and the second metal portion.

10. The imaging apparatus according to claim 5,
wherein each of the plurality of thermocouples is disposed such that areas between one ends and the other ends of the first metal portion and the second metal portion are disposed so as to be aligned along the light receiving face, the one end of the first metal portion and the one end of the second metal portion are bonded together, and the plurality of thermocouples are connected in series at the other end of the first metal portion and the other end of the second metal portion, and
wherein a light shielding film that shields the incidence light is disposed such that the other end of the first metal portion and the other end of the second metal portion are coated with the light shielding film.

11. The imaging apparatus according to claim 1,
wherein the pixel includes a plurality of the thermocouple device groups, and
wherein the plurality of thermocouple device groups are disposed so as to be stacked in a depth direction of the substrate.

12. The imaging apparatus according to claim 1, further comprising:
a signal correcting unit that corrects a signal according to the electromotive force generated in the pixel,
wherein the signal correcting unit calculates a correction coefficient based on a difference value between monitoring data and reference data and a response function of the electromotive force for a light intensity of the incidence light, and corrects the signal according to the electromotive force generated in the pixel by integrating the correction coefficient with the signal according to the electromotive force generated in the pixel.

13. The imaging apparatus according to claim 1, further comprising: a cooling processing unit that performs a cooling process for the plurality of thermocouples based on a Peltier effect by causing a current to flow in a direction opposite to a direction of a current flowing based on a Seebeck effect in each of the plurality of thermocouples,
wherein the cooling processing unit allows the currents in the opposite direction to flow in the plurality of thermocouples so as to decrease an amount of heat corresponding to a difference value between a signal value of the signal according to the electromotive force generated in the pixel and a reference value.

14. The imaging apparatus according to claim 1, wherein the imaging unit generates a signal by detecting an electric potential at a time point at which the electromotive force generated in the thermocouple device group is a maximum in one frame time and thus generates a captured image.

15. The imaging apparatus according to claim 1, wherein the imaging unit, after repeating a plurality of electric potential detecting operations, in which a signal is generated by detecting an electric potential at a time point, at which the electromotive force generated in the thermocouple device group is a maximum in one frame time, generates a captured image based on a signal acquired by integrating a plurality of the signals.

16. The imaging apparatus according to claim 15, wherein the imaging unit performs a cooling operation in which the thermocouple device group is cooled during the plurality of electric potential detecting operations.

17. The imaging apparatus according to claim 16, wherein the imaging unit is configured so as to be driven by applying the electromotive force generated in the thermocouple device group as feedback as a driving power.

18. A method of manufacturing an imaging apparatus, the method comprising:
forming an imaging unit by disposing a plurality of pixels that receive incidence light on a light receiving face in an imaging region of a substrate,
wherein the forming of an imaging unit includes forming a thermocouple device group, in which a plurality of thermocouples are aligned along the light receiving face, in the pixel,
wherein, in the forming of a thermocouple device group, the plurality of thermocouples are arranged so as to be separated from each other such that the light receiving face of the thermocouple device group has a grating structure, and
wherein the thermocouple device group is formed such that the incidence light is incident to the grating structure so as to cause plasmon resonance to occur on the light receiving face, and an electromotive force is generated due to a change in the temperature of a portion of the thermocouple device group, at which the plasmon resonance occurs, in each of the plurality of thermocouples.

19. An electronic apparatus comprising:

an imaging unit in which a plurality of pixels receiving incidence light on a light receiving face are disposed in an imaging region of a substrate, wherein the pixel includes a thermocouple device group in which a plurality of thermocouples are aligned along the light receiving face, wherein, in the thermocouple device group, the plurality of thermocouples are arranged so as to be separated from each other such that the light receiving face has a grating structure, and wherein the thermocouple device group is disposed such that the incidence light is incident to the grating structure so as to cause plasmon resonance to occur on the light receiving face, and an electromotive force is generated due to a change in the temperature of a portion of the thermocouple device group, at which the plasmon resonance occurs, in each of the plurality of thermocouples.

* * * * *